(12) United States Patent
Baba

(10) Patent No.: US 10,020,319 B2
(45) Date of Patent: Jul. 10, 2018

(54) SEMICONDUCTOR MEMORY DEVICE HAVING PILLARS ON A PERIPHERAL REGION AND METHOD OF MANUFACTURING THE SAME

(71) Applicant: Toshiba Memory Corporation, Tokyo (JP)

(72) Inventor: Yasuyuki Baba, Ayase Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/233,885

(22) Filed: Aug. 10, 2016

(65) Prior Publication Data

US 2017/0213845 A1    Jul. 27, 2017

(30) Foreign Application Priority Data

Jan. 27, 2016 (JP) ................. 2016-013304

(51) Int. Cl.
*H01L 29/66* (2006.01)
*H01L 27/11582* (2017.01)
(Continued)

(52) U.S. Cl.
CPC .. *H01L 27/11582* (2013.01); *H01L 21/28282* (2013.01); *H01L 27/1157* (2013.01);
(Continued)

(58) Field of Classification Search
CPC ......... H01L 21/28282; H01L 29/66833; H01L 27/11563; H01L 29/4234; H01L 29/792–29/7926
See application file for complete search history.

(56) References Cited

U.S. PATENT DOCUMENTS 7,936,004 B2    5/2011   Kito et al.
9,165,823 B2    10/2015  Chen
(Continued)

FOREIGN PATENT DOCUMENTS

JP    2007266143 A    10/2007
TW      201530697 A     8/2015

OTHER PUBLICATIONS

Taiwan Office Action dated Jul. 19, 2017, filed in Taiwan counterpart Application No. 105120355, 6 pages (with translation).

*Primary Examiner* — Julia Slutsker
(74) *Attorney, Agent, or Firm* — Patterson & Sheridan, LLP

(57) ABSTRACT

A semiconductor memory device includes a plurality of wiring layers formed on a substrate, one or more first pillars penetrating through the wiring layers on a memory region of the substrate and in contact with the substrate, a plurality of memory transistors being formed at portions of each of the one or more first pillars that penetrate the wiring layers, and one or more second pillars penetrating through at least one of the wiring layers on a peripheral region of the substrate and in contact with the substrate. Each of the first and second pillars includes a semiconductor portion, a first insulating layer formed around the semiconductor portion, a charge accumulation layer formed around the first insulating layer, and a second insulating layer formed around the charge accumulation layer.

9 Claims, 31 Drawing Sheets

(51) Int. Cl.
  *H01L 27/1157* (2017.01)
  *H01L 29/792* (2006.01)
  *H01L 29/423* (2006.01)
  *H01L 21/28* (2006.01)

(52) U.S. Cl.
  CPC .. *H01L 29/42344* (2013.01); *H01L 29/66833* (2013.01); *H01L 29/792* (2013.01)

(56) References Cited

U.S. PATENT DOCUMENTS

| | | | |
|---|---|---|---|
| 2010/0207195 A1* | 8/2010 | Fukuzumi | G11C 16/0483 257/326 |
| 2012/0243314 A1 | 9/2012 | Maeda | |
| 2013/0163329 A1 | 6/2013 | Tokiwa | |
| 2013/0329494 A1 | 12/2013 | Shirakawa | |
| 2014/0061754 A1* | 3/2014 | Murakami | H01L 29/66833 257/315 |
| 2014/0078827 A1 | 3/2014 | Tanzawa | |
| 2014/0241026 A1 | 8/2014 | Tanzawa | |
| 2014/0293695 A1 | 10/2014 | Kono | |
| 2014/0347929 A1 | 11/2014 | Tanzawa | |
| 2014/0362641 A1 | 12/2014 | Dong et al. | |
| 2016/0322381 A1* | 11/2016 | Liu | H01L 27/11573 |

* cited by examiner

SEMICONDUCTOR MEMORY DEVICE HAVING PILLARS ON A PERIPHERAL REGION AND METHOD OF MANUFACTURING THE SAME

CROSS-REFERENCE TO RELATED APPLICATION

This application is based upon and claims the benefit of priority from Japanese Patent Application No. 2016-013304, filed on Jan. 27, 2016, the entire contents of which are incorporated herein by reference.

FIELD

Embodiments described herein relate generally to a semiconductor memory device and a method of manufacturing the same.

BACKGROUND

A NAND-type flash memory is known as a semiconductor memory device.

DETAILED DESCRIPTION

Figure 1:
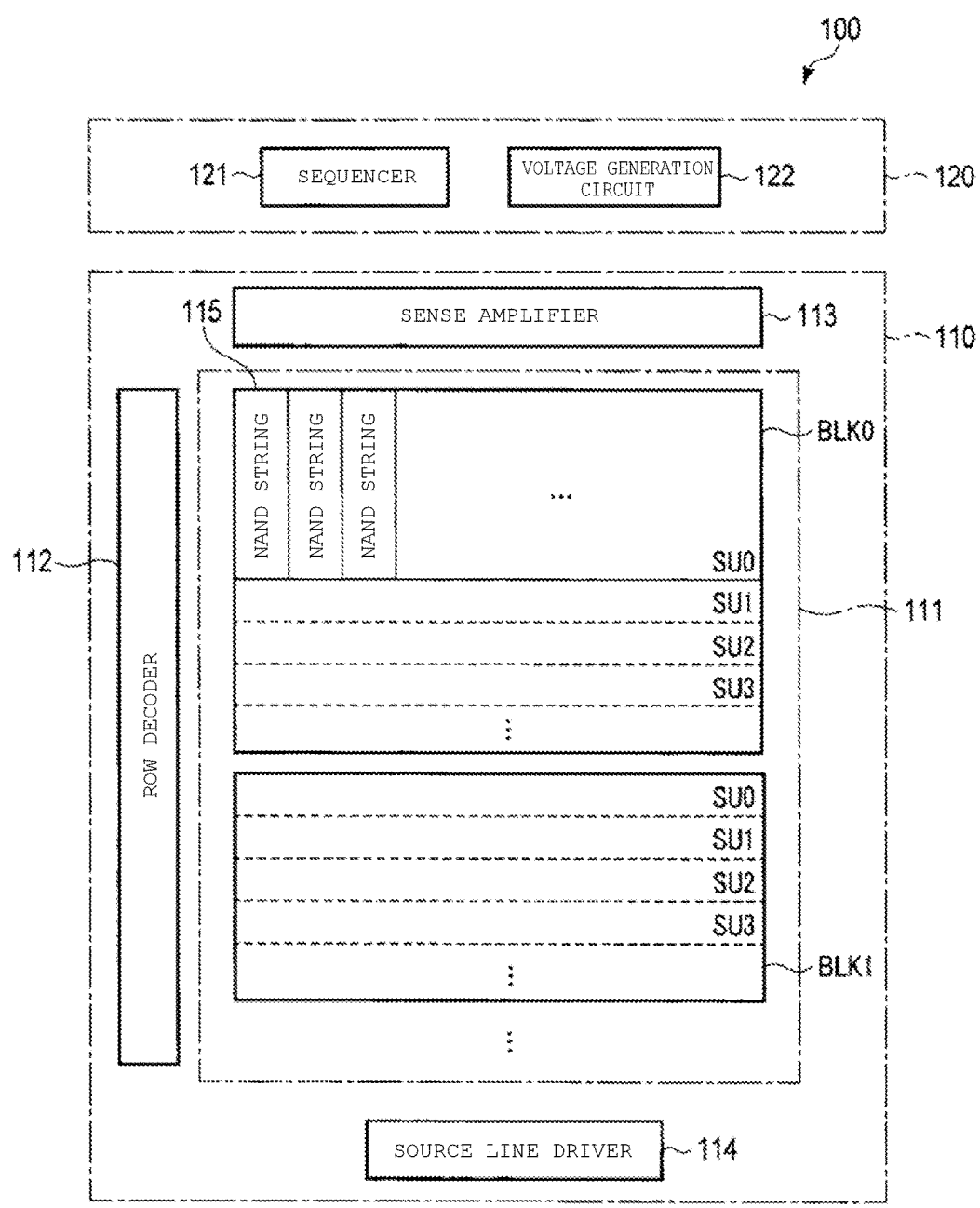
FIG. 1 is a block diagram of a semiconductor memory device according to an embodiment.

One embodiment provides a semiconductor memory device which can reduce fabrication cost and a method of fabricating the semiconductor memory device.

In general, according to an embodiment, a semiconductor memory device includes a plurality of wiring layers formed on a substrate, one or more first pillars penetrating through the wiring layers on a memory region of the substrate and in contact with the substrate, a plurality of memory transistors being formed at portions of each of the one or more first pillars that penetrate the wiring layers, and one or more second pillars penetrating through at least one of the wiring layers on a peripheral region of the substrate and in contact with the substrate. Each of the first and second pillars includes a semiconductor portion, a first insulating layer formed around the semiconductor portion, a charge accumulation layer formed around the first insulating layer, and a second insulating layer formed around the charge accumulation layer.

Hereinafter, embodiments will be described with reference to the accompanying drawings. In the following description, the same symbols or reference numerals will be used for the elements having the same functions and/or configurations.

In the following embodiments, a three-dimensional stacked NAND-type flash memory in which memory cell transistors are stacked above a semiconductor substrate will be described as an example of a semiconductor memory device.

1 Configuration

A configuration of a semiconductor memory device according to an embodiment will be described.

1.1 Overall Configuration of Semiconductor Memory Device

First, an overall configuration of the semiconductor memory device will be described with reference to FIG. 1. As illustrated in FIG. 1, a NAND-type flash memory 100 includes a core unit 110 and a peripheral circuit 120.

The core unit 110 includes a memory cell array 111, a row decoder 112, a sense amplifier 113, and a source line driver 114.

The memory cell array 111 includes multiple blocks BLK (BLK0, BLK1, . . . ), each being a set of multiple nonvolatile memory cell transistors. For example, data stored in the blocks BLK can be erased in units of block BLK.

Each of the blocks BLK includes multiple string units SU (SU0, SU1, . . . ). In addition, each of the string units SU includes multiple NAND strings 115. Multiple memory cell transistors are connected in series in each of the NAND strings 115. The numbers of the blocks BLK, the string units SU, and the NAND strings 115 in the memory cell array 111 are arbitrary.

The row decoder 112 decodes addresses of the blocks BLK or addresses of pages, when data writing and data reading is performed, and selects a target word line.

The sense amplifier 113 senses data which is read into a bit line from a memory cell transistor and amplifies the sensed data, when data reading is performed. In addition, when data writing is performed, the sense amplifier 113 transmits the write data to the memory cell transistor.

The source line driver 114 applies a required voltage to a source line, when data are written, read, and erased.

The peripheral circuit 120 includes a sequencer 121 and a voltage generation circuit 122.

The sequencer 121 controls overall operations of the NAND type flash memory 100.

The voltage generation circuit 122 generates voltages required for writing, reading, and erasing data, and supplies the voltages to the row decoder 112, the sense amplifier 113, the source line driver 114, and the like.

A configuration of the memory cell array 111 in the three-dimensional stacked NAND-type flash memory is described in, for example, U.S. patent application Ser. No. 12/407,403 filed on Mar. 19, 2009 and entitled "THREE DIMENSIONAL STACKED NONVOLATILE SEMICONDUCTOR MEMORY". In addition, the configuration is also described in U.S. patent application Ser. No. 12/406,524 filed on Mar. 18, 2009 and entitled "THREE DIMENSIONAL STACKED NONVOLATILE SEMICONDUCTOR MEMORY", U.S. patent application Ser. No. 12/679,991 filed on Mar. 25, 2010 and entitled "NON-VOLATILE SEMICONDUCTOR STORAGE DEVICE AND METHOD OF MANUFACTURING THE SAME", and U.S. patent application Ser. No. 12/532,030 filed on Sep. 18, 2009 and entitled "SEMICONDUCTOR MEMORY INCLUDING THREE-DIMENSIONALLY ARRANGED MEMORY CELLS AND METHOD FOR MANUFACTURING SAME". All of these patent applications are incorporated in the present specification by reference.

Furthermore, the unit of data erasing is not limited to the block BLK. For example, a plurality of blocks BLK may be collectively erased, and only a partial region of a block BLK may be erased.

Erasure of data is described in, for example, U.S. patent application Ser. No. 12/694,690 filed on Jan. 27, 2010 and entitled "NON-VOLATILE SEMICONDUCTOR STORAGE DEVICE", and U.S. patent application Ser. No. 13/235,389 filed on Sep. 18, 2011 and entitled "NON-VOLATILE SEMICONDUCTOR MEMORY DEVICE". All of these patent applications are incorporated in the present specification by reference.

1.2 Configuration of Memory Cell Array

Next, a configuration of the memory cell array 111 will be described with reference to FIG. 2.

Figure 2:
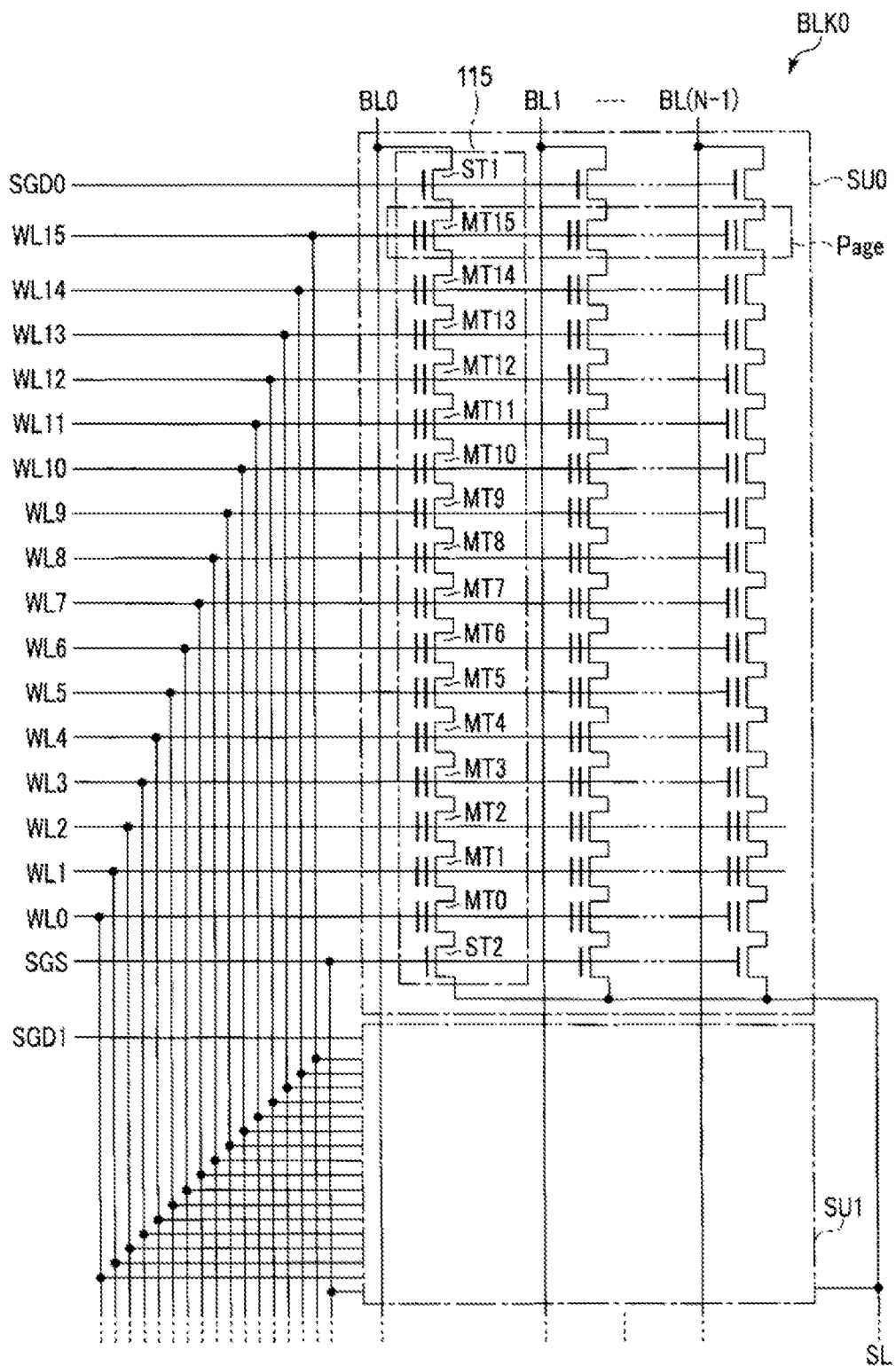
FIG. 2 is a circuit diagram of a string unit of the semiconductor memory device according to the embodiment.

As described in FIG. 2, each of the NAND strings 115 includes, for example, 16 memory cell transistors MT (MT0 to MT15), and selection transistors ST1 and ST2. Each of the memory cell transistors MT includes a stacked gate having a control gate and an electric charge accumulation layer, and retains data in a non-volatile manner. Each of the memory cell transistors MT may be a MONOS-type transistor in which an insulating film is used for the electric charge accumulation layer, and may be a FG-type transistor in which a conductive film is used for the electric charge accumulation layer. Hereinafter, in the present embodiment, a MONOS-type transistor will be described as an example. Furthermore, the number of the memory cell transistors MT is not limited to 16, and may be eight, 32, 64, 128, or the like. There is no limit to the number of the memory cell transistors MT. Furthermore, the number of the selection transistors ST1 and ST2 is arbitrary.

Current paths of the memory cell transistors MT0 to MT15 are connected in series to each other. In addition, a drain of the memory cell transistor MT15 is connected to a source of the selection transistor ST1, and a source of the memory cell transistor MT0 is connected to a drain of the selection transistor ST2.

Gates of the selection transistors ST1 in each of the string units SU are connected in common to the same select gate line SGD. In FIG. 2, the gates of the selection transistors ST1 in the string unit SU0 of the block BLK0 are connected in common to the select gate line SGD0, and the gates of the selection transistors ST1 in the string unit SU1 are connected in common to the select gate line SGD1.

In addition, gates of the selection transistors ST2 in the same blocks BLK are connected in common to the same select gate line SGS.

In addition, control gates of the memory cell transistors MT0 to MT15 of each of the NAND strings 115 in each of the blocks BLK are respectively connected to word lines WL0 to WL15 which are different from each other.

In addition, in the NAND strings 115 which are disposed in a matrix configuration in the memory cell array 111, drains of the selection transistors ST1, which are arranged in the same row, of the NAND strings 115 are respectively connected to bit lines BL (BL0 to BL (N−1), (N−1) is a natural number equal to or larger than "1") that are different from each other. In addition, drains of the selection transistors ST1, which are arranged in the same column, of the NAND strings 115 are connected in common to any one of the bit lines BL0 to BL(N−1). That is, the bit lines BL are connected in common to the NAND strings 115 between the multiple blocks BLK. In addition, sources of the selection transistors ST2 in each of the blocks BLK are connected in common to a source line SL. That is, the source line SL is connected in common to, for example, the NAND strings 115 between the multiple blocks BLK.

Figure 3:
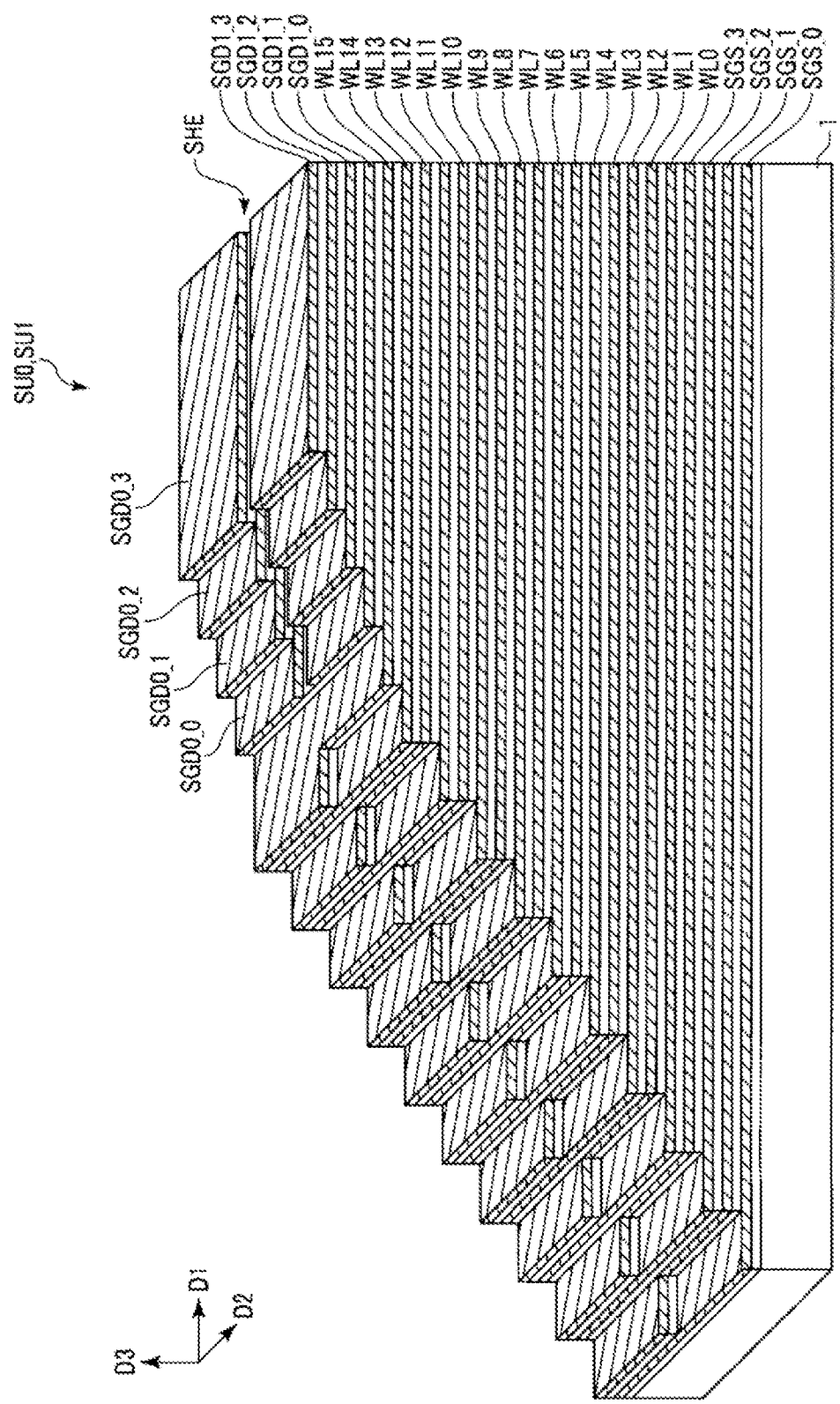
FIG. 3 is a perspective view of select gate lines and word lines of a string group of the semiconductor memory device according to the embodiment.
Figure 4:
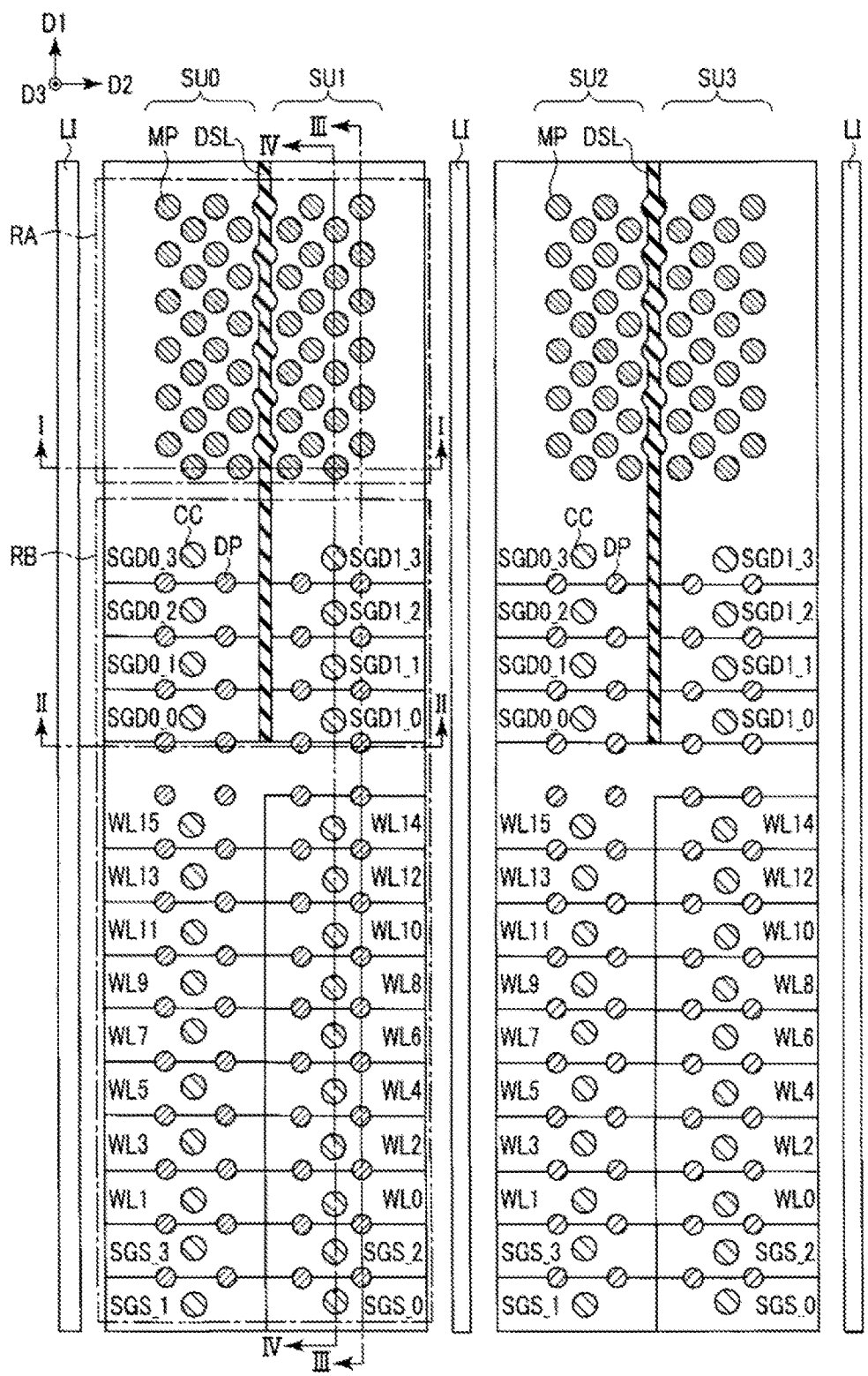
FIG. 4 is a plan view of string groups of the semiconductor memory device according to the embodiment.
Figure 5:
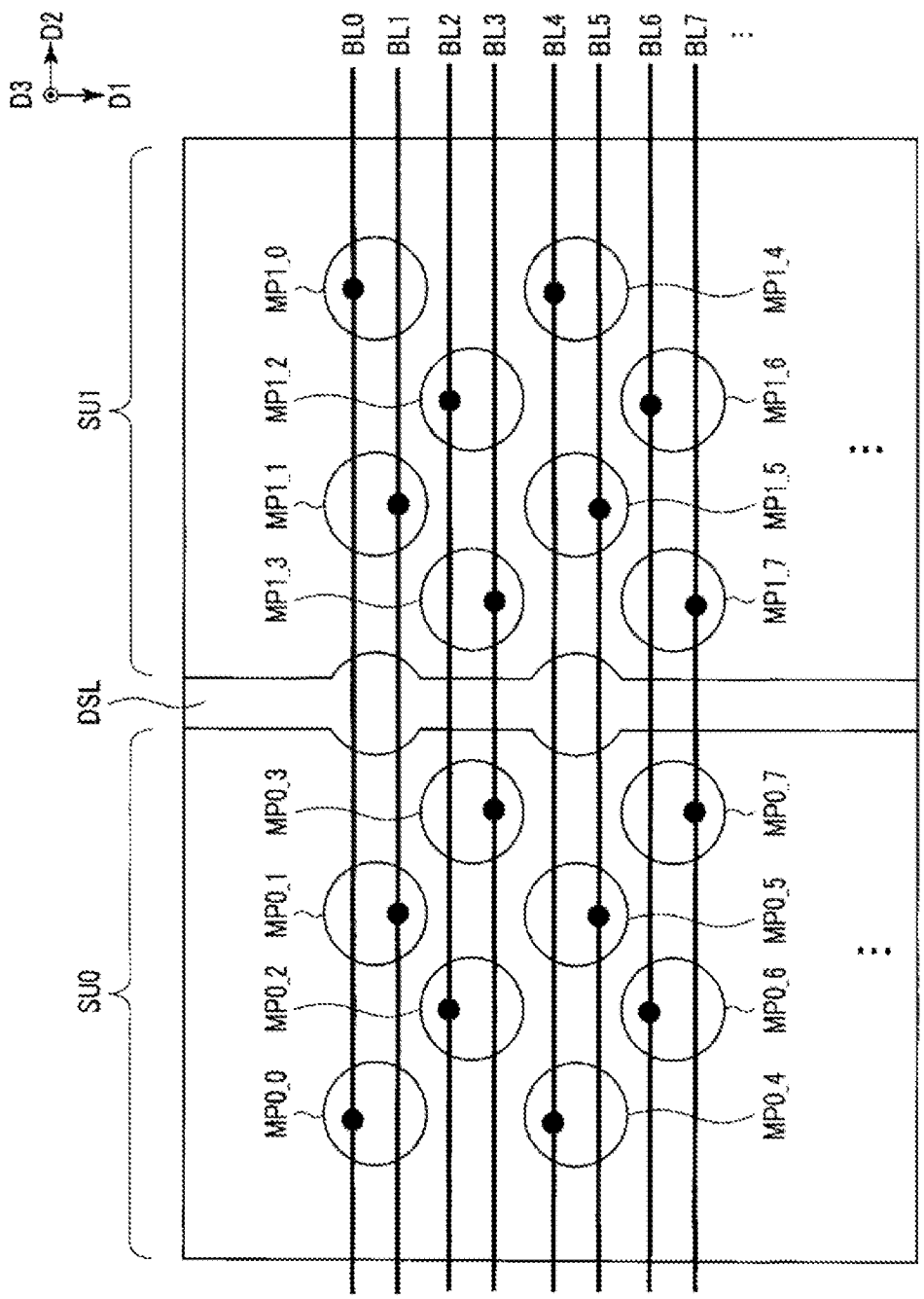
FIG. 5 is a plan view of a region RA of a string group illustrated in FIG. 4.
Figure 6:
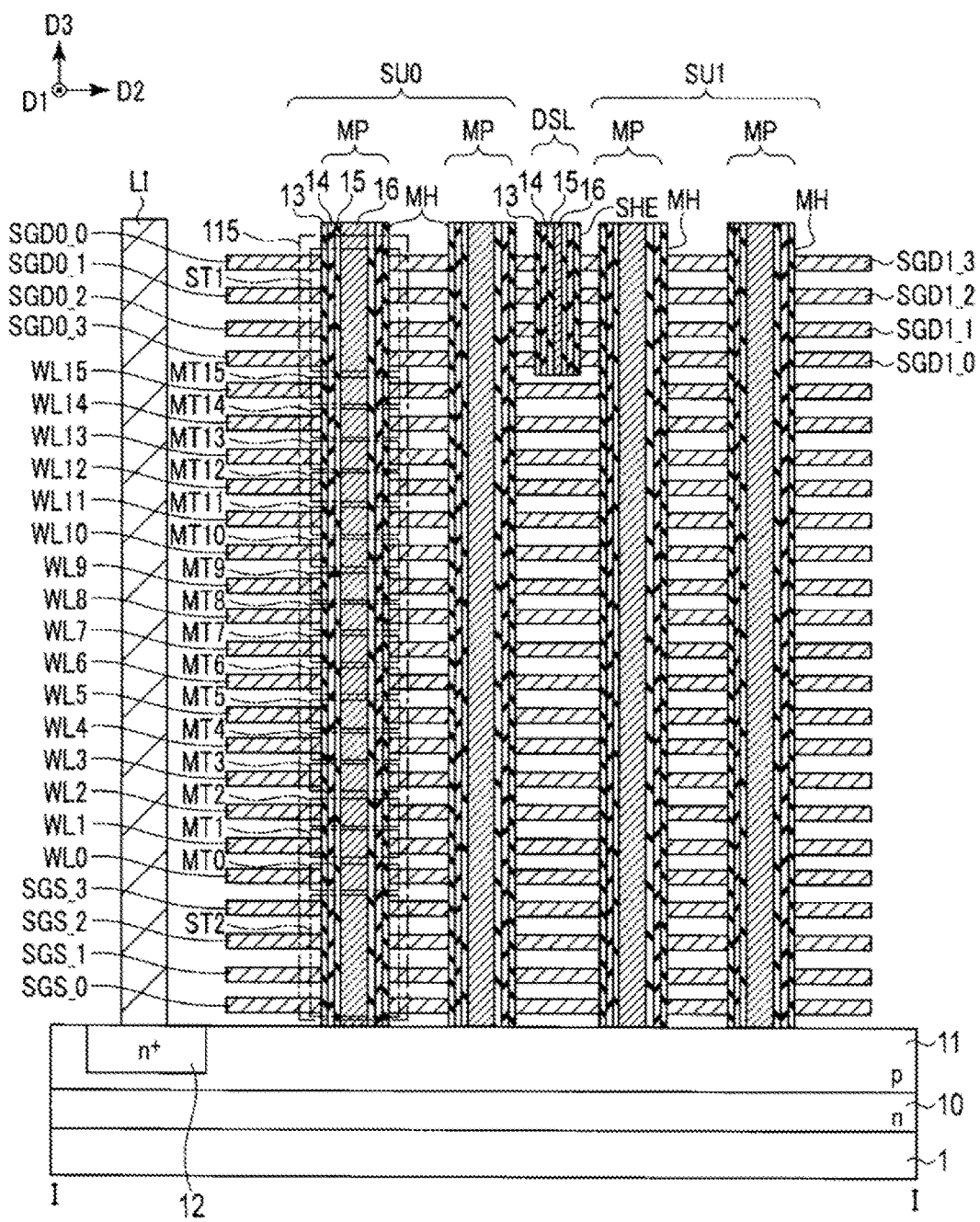
FIG. 6 is a cross-sectional view of the string group taken along line I-I illustrated in FIG. 4.
Figure 7:
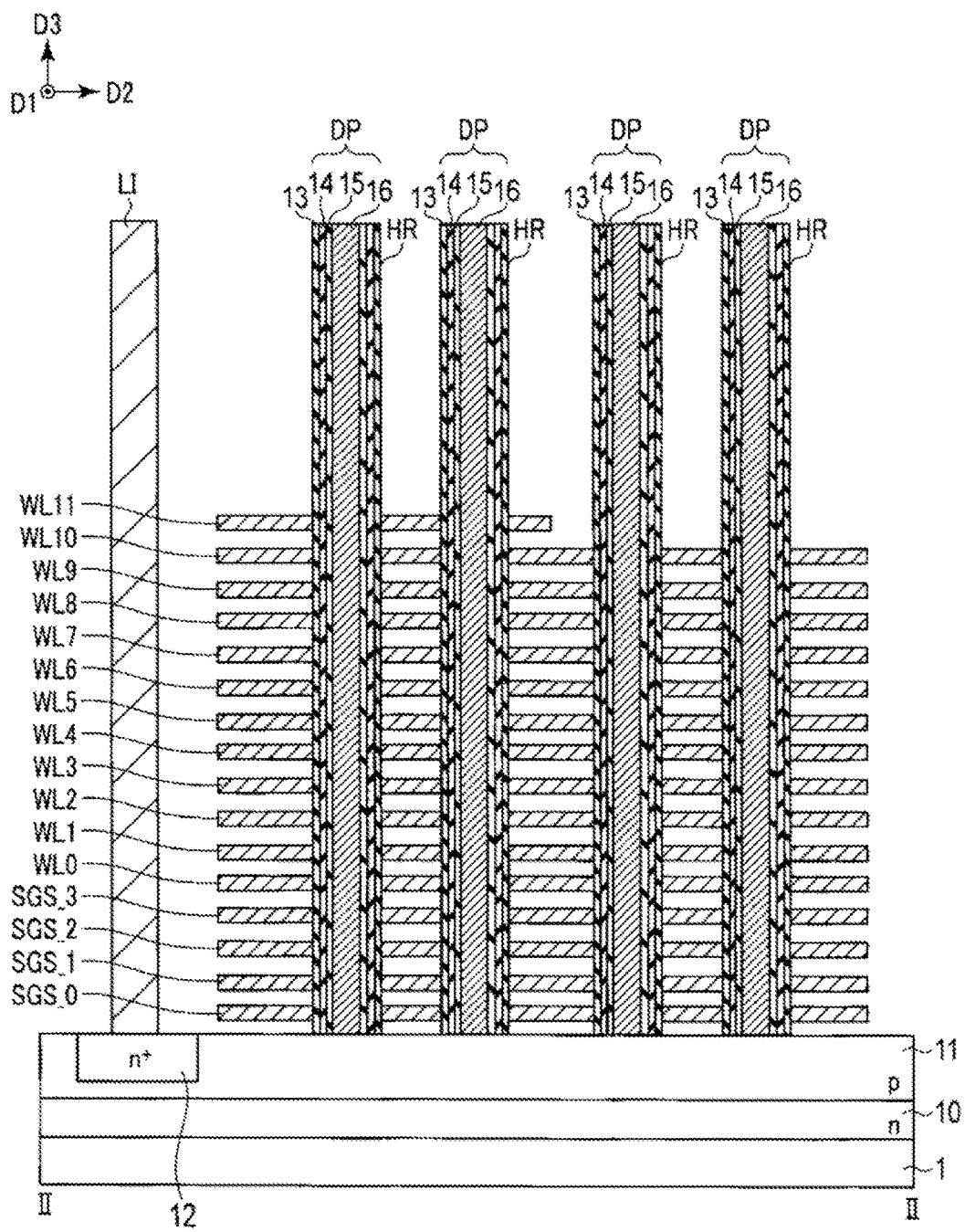
FIG. 7 is a cross-sectional view of the string group taken along line II-II illustrated in FIG. 4.
Figure 8:
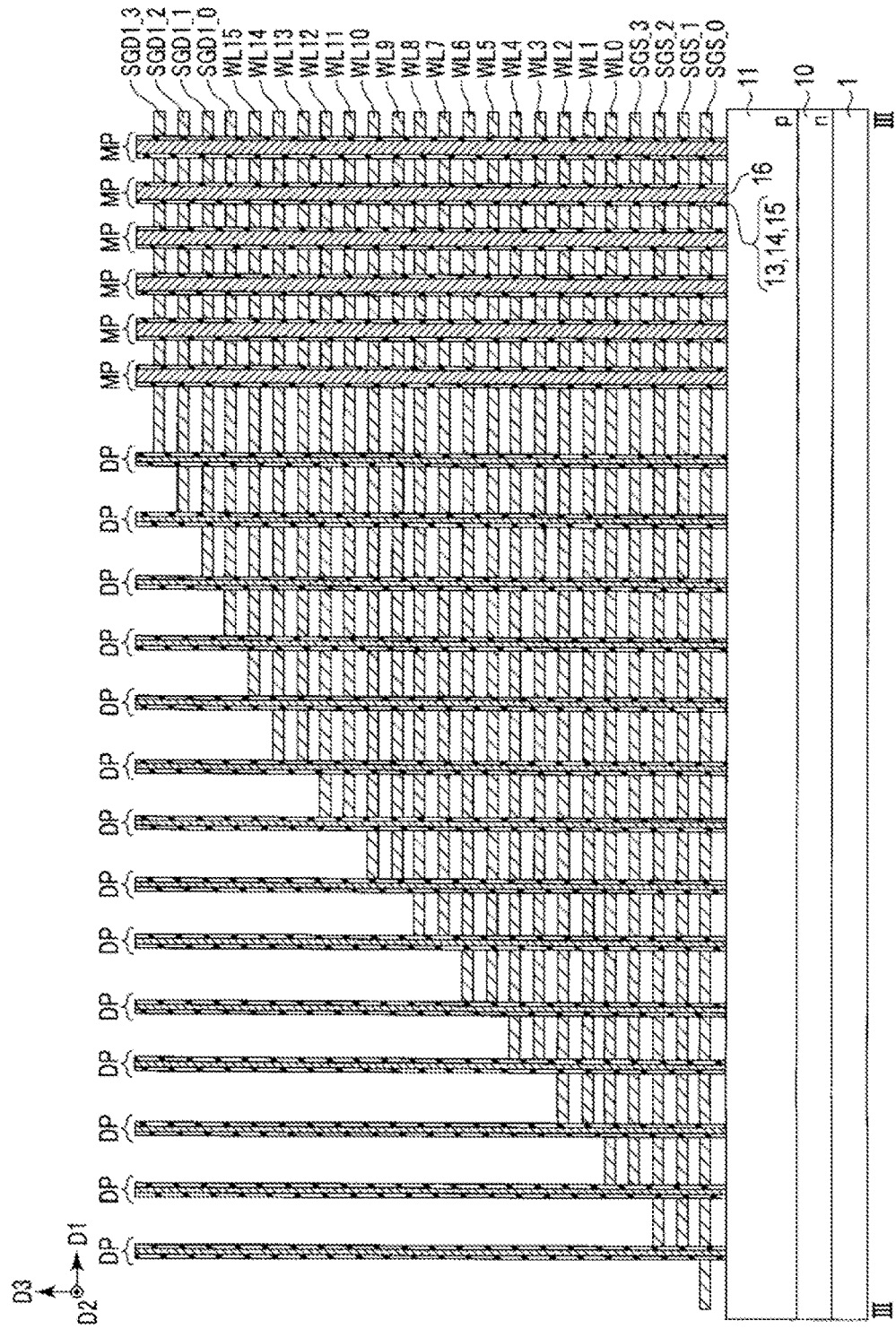
FIG. 8 is a cross-sectional view of the string group taken along line III-III illustrated in FIG. 4.
Figure 9:
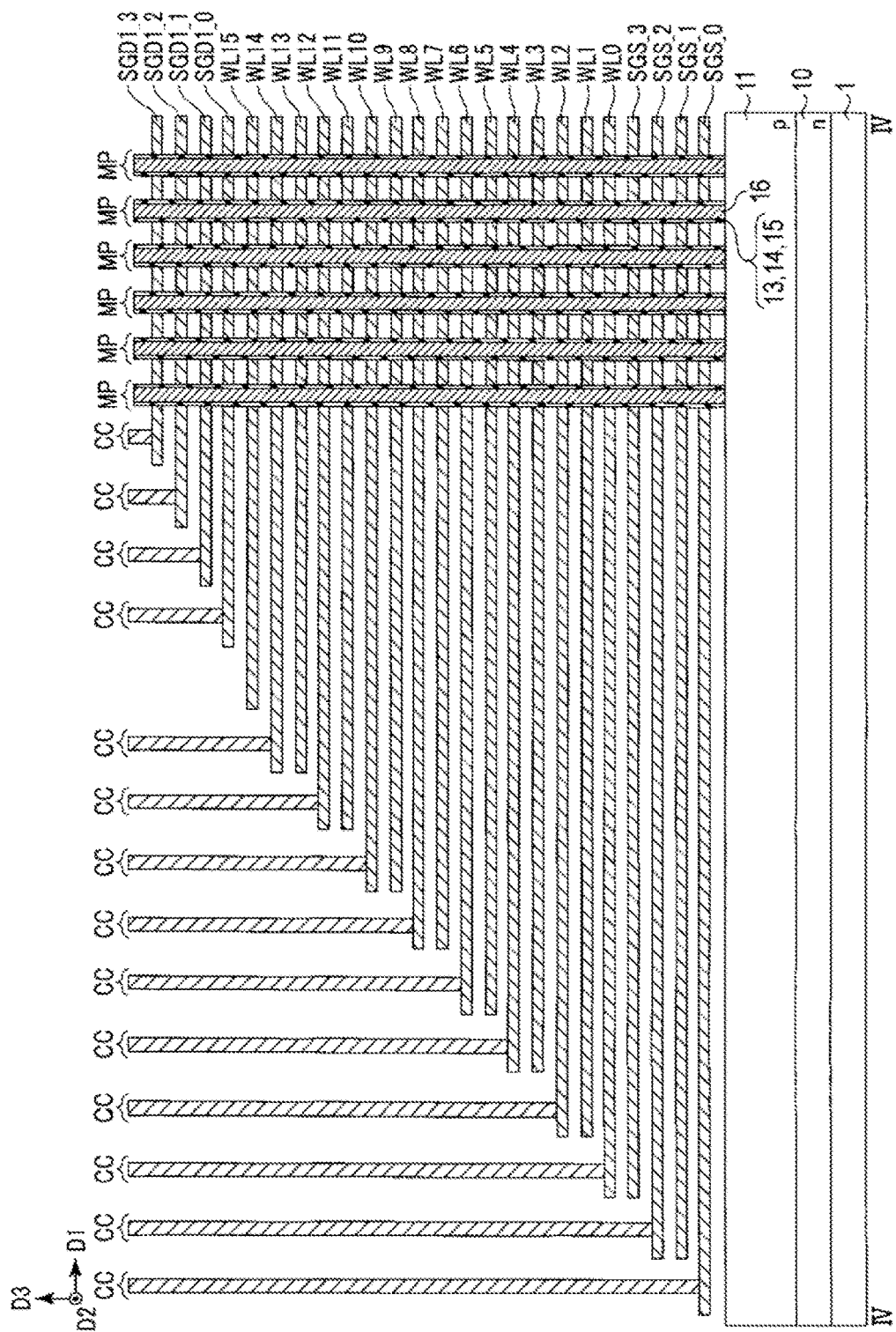
FIG. 9 is a cross-sectional view of the string group taken along line IV-IV illustrated in FIG. 4.

Next, a detailed structure of the memory cell array 111 will be described with reference to FIG. 3 to FIG. 9. FIG. 3 is a perspective view of word lines WL, select gate lines SGD and SGS in the string units SU0 and SU1. FIG. 4 is a plan view of the string units SU0 to SU4. FIG. 5 is a plan view of a region RA illustrated in FIG. 4, and illustrates a connection between the NAND strings 115 and the bit lines BL. FIG. 6 is a cross-sectional view of the memory cell array 111 taken along line I-I illustrated in FIG. 4, FIG. 7 is a cross-sectional view of the memory cell array 111 taken along line II-II illustrated in FIG. 4, FIG. 8 is a cross-sectional view of the memory cell array 111 taken along line III-III illustrated in FIG. 4, and FIG. 9 is a cross-sectional view of the memory cell array 111 taken along line IV-IV illustrated in FIG. 4. FIG. 6 and FIG. 7 illustrate cross-sections of the string units SU0 and SU1, and FIG. 8 and FIG. 9 illustrate a cross-section of the string unit SU1. In FIG. 3, a memory hole MH and a hole HR, which will be described below, are omitted to make simple description. In addition, in FIG. 6 to FIG. 9, an interlayer insulating film is omitted.

As illustrated in FIG. 3, in the memory cell array 111 according to the present embodiment, two string units SU share the word lines WL and the select gate lines SGS with each other. Hereinafter, the two string units SU which share the word lines WL and the select gate lines SGS are referred to as a string group. More specifically, the string units SU0 and SU1 includes the select gate lines SGS (SGS_0 to SGS_3) of four layers and the word lines WL0 to WL15 sequentially from a lower layer, in a third direction D3 perpendicular to a semiconductor substrate 1. In addition, the string unit SU0 includes the select gate lines SGD0_0 to SGD0_3 of four layers above the word line WL15, and the string unit SU1 includes the select gate lines SGD1_0 to SGD1_3 of four layers above the word line WL15.

The select gate lines SGD0 (SGD0_0 to SGD0_3) included in the string unit SU0 and the select gate lines SGD1 (SGD1_0 to SGD1_3) included in the string unit SU1 are configured such that interconnect layers in the same layer are separated from each of the string units SU by a slit SHE. More specifically, for example, the select gate lines SGD0_3 and SGD1_3 are interconnect layers in the same layer, but are separated by the slit SHE. Hereinafter, if the select gate lines SGS_0 to SGS_3 are not distinguished, the select gate lines SGS_0 to SGS_3 are referred to as the select gate line SGS. In addition, if the select gate lines SGD0_0 to SGD0_3 and SGD1_0 to SGD1_3 are not distinguished, the select gate lines SGD0_0 to SGD0_3 and SGD1_0 to SGD1_3 are respectively referred to as SGD0 and SGD1.

One ends of the select gate lines SGD and SGS and the word lines WL protrude in a stepwise shape of two columns in parallel with each other, in a first direction D1 parallel to the semiconductor substrate 1. Hereinafter, a portion of the stepwise shape is referred to as a "stepwise portion", and a flat portion of each end of the stepwise portion is referred to as "extended portion". Each of the select gate lines SGD and SGS and the word lines WL includes an extended portion. More specifically, the extended portions of the select gate lines SGS_1 and SGS_3, the odd word lines (WL1, WL3, WL5, WL7, WL9, WL11, WL13, and WL15), and the select gate lines SGD0_0 to SGD0_3 of the string units SU0 are disposed in a stepwise manner in the first direction D1 (hereinafter, referred to as "first stepwise portion"). In addition, at a location adjacent to these, the extended portions of the select gate lines SGS_0 and SGS 2, the even word lines (WL0, WL2, WL4, WL6, WL8, WL10, WL12, and WL14), the word line WL15, and the select gate lines SGD1_0 to SGD1_3 of the string units SU1 are disposed in a stepwise manner in the first direction D1 (hereinafter, referred to as "second stepwise portion"). In the present embodiment, the extended portion of the word line WL15 protrudes in the first and second stepwise portions. In addition, a length of the word line WL15 in the first direction D1 is greater than that of the slit SHE. Accordingly, for example, even if the slit SHE penetrates the word line WL15, only a part of the word line WL15 is cut, but the word line WL15 is connected to the extended portion. Thus, the word line WL15 is not divided into two pieces like the select gate lines SGD.

In addition, each of the select gate lines SGD and SGS and the word lines WL is connected to wires (not illustrated) that are located above through a contact plug CC, in the extended portion.

The word lines WL and the select gate lines SGS may be partially cut by the slit SHE, and the shapes of the word lines WL and the select gate lines SGS are not particularly limited, unless the word lines WL and the select gate lines SGS are completely divided into two pieces when the slit SHE is formed.

Furthermore, the extended portions of each of the select gate lines SGD and SGS and the word lines WL can be arbitrarily disposed. For example, disposition of the odd word lines WL of the first stepwise portion may be replaced with disposition of the even word lines WL of the second stepwise portion. In addition, the extended portions of the word lines WL and the select gate lines SGS may be disposed in a stepwise shape of one column in the first direction D1, and may be disposed in a stepwise shape of three columns or more.

Next, disposition of the string units SU will be described. As illustrated in FIG. 4, multiple source line contacts LI are periodically disposed in a second direction D2, and one string group is disposed between two source line contacts LI. The source line contact LI is connected to the semiconductor substrate 1 and the source line SL (not illustrated) above the NAND strings 115. The one string group includes the region RA which includes the multiple NAND strings 115, and a region RB which includes the first and second stepwise portions.

First, the region RA will be described. In the region RA, multiple memory pillars MP in the string group are disposed in a staggered arrangement of nine columns in the second direction D2. The memory pillar MP includes a semiconductor layer, and the semiconductor layer functions as a current path of the NAND string 115. In the present embodiment, one memory pillar MP corresponds to one NAND string 115.

The memory pillar MP which is located at the center of the staggered arrangement of nine columns serves as a part of a dummy line DSL. The dummy line DSL is a dummy wire which is formed by filling the slit SHE. The contact plug is not formed on an upper surface of the dummy line DSL, and the dummy line DSL is not electrically connected to a wire of an upper layer (not illustrated).

Connection between the memory pillar MP and the bit line BL will be described with reference to FIG. 5. As described in FIG. 5, the contact plug is formed on an upper surface of the memory pillar MP, and the contact plug is connected to the bit line BL. More specifically, for example, the memory pillar MP0_0 of the string unit SU0 and the memory pillar MP1_0 of the string unit SU1 are connected in common to the bit line BL0. Also in the other memory pillars MP, one memory pillar MP of the string unit SU0 and one memory pillar MP of the string unit SU1 are connected in common to one bit line BL, in the same manner as above.

The multiple memory pillars MP may not be disposed in the staggered arrangement of nine columns, and the arrangement of the memory pillars MP can be arbitrarily set. Furthermore, the memory pillar MP that is located at the center of the staggered arrangement of the nine columns, overlapping the dummy line DSL, may be omitted.

The region RB will be described with reference to FIG. 4. In the region RB, dummy pillars DP are disposed between two extended portions which are disposed in the first direction D1. When gaps corresponding to the select gate lines SGD and SGS and the word lines WL are filled with metal such as tungsten (W), the dummy pillars DP function as columns which support interlayer insulating films between the select gate lines SGD and SGS and the word lines WL which are gaps. In the same manner as the dummy line DSL, a contact plug is not formed on the dummy pillar DP, and the dummy pillar DP is not electrically connected to a wire of an upper layer (not illustrated).

More specifically, two dummy pillars DP are disposed between the extended portions of, for example, the select gate lines SGD0_3 and SGD0_2, and two dummy pillars DP are disposed between the extended portions of, for example, the select gate lines SGD1_3 and SGD1_2. That is, four dummy pillars DP are disposed in the second direction D2 in one string group. In addition, since the extended portion of the word line WL15 has a wide area, the dummy pillar DP is also disposed around the center of the word line WL15 in the first direction D1.

In addition, a single contact plug CC is provided in each extended portion, and is disposed in the center of the extended portion.

A position and the number of the dummy pillar DP are not limited so long as the dummy pillar DP does not contact the dummy line DSL and the contact plug CC. When regions corresponding to the select gate lines SGD and SGS and the word lines WL are gaps, it is preferable that the dummy pillar DP is suitably disposed and the number of dummy pillars DP is suitable so as to support the interlayer insulating film.

Furthermore, the single contact plug CC is provided in each extended portion, but may be two pieces or more, and the number of contact plugs CC which are connected to one extended portion is not limited.

Next, a cross-sectional structure of the region RA in which the NAND strings 115 is formed will be described. As illustrated in FIG. 6, the NAND strings 115, that is, the memory pillars MP are formed in a third direction D3. The memory pillars MP of the string units SU0 and SU1 are connected in common to the interconnect layer corresponding to the word lines WL (WL0 to WL15) and the select gate lines SGS (SGS_0 to SGS_3). In addition, the memory pillars MP of the string unit SU0 are connected in common to the interconnect layers corresponding to the select gate lines SGD0 (SGD0_1 to SGD0_4), and the memory pillars MP of the string units SU0 are connected in common to the interconnect layers corresponding to the select gate lines SGD1 (SGD1_0 to SGD1_3).

More specifically, an n-type well 10 is provided in a surface region of the semiconductor substrate 1, and a p-type well 11 is provided in a surface region of the n-type well 10. In addition, an $n^+$-type diffusion layer 12 is provided in a surface region of the p-type well 11. In addition, four interconnect layers which function as the select gate lines SGS_0 to SGS_3, 16 interconnect layers which function as the word lines WL0 to WL15, and four interconnect layers which function as the select gate lines SGD0_0 to SGD0_3 or the select gate lines SGD1_0 to SGD1_3 are sequentially stacked on the semiconductor substrate 1. In addition, an insulating layer (not illustrated) is provided between the interconnect layers.

In addition, a memory hole MH which penetrates the interconnect layer and the insulating layer to reach the p-type well 11 is provided. A block insulating film 13, an electric charge accumulation layer 14, and a tunnel insulating film 15 are sequentially stacked on a side surface of the memory hole MH, and the inside of the memory hole MH is filled with a material of a semiconductor layer 16. That is, the memory pillar MP includes the semiconductor layer 16, and the block insulating film 13, the electric charge accumulation layer 14, and the tunnel insulating film 15 which are provided on the side surface of the semiconductor layer 16. The block insulating film 13 and the tunnel insulating film 15 are formed of, for example, an $SiO_2$ film. The electric charge accumulation layer 14 is formed of, for example, an SiN film. The semiconductor layer 16 is formed of, for example, polycrystalline silicon. The semiconductor layer 16 in the memory pillar MP is a region in which a channel is formed when the memory cell transistors MT and the selection transistors ST1 and ST2 are turned on.

The memory cell transistors MT0 to MT15 are formed by the memory pillars MP and the word lines WL0 to WL15. In the same manner, the selection transistors ST1 and ST2 are formed by the memory pillar MP and select gate lines SGD and SGS. In FIG. 6, the select gate lines SGD and SGS are respectively configured by four layers, but are electrically and respectively connected to each other in common, and actually function as a gate electrode of one of the selection transistors ST1 and ST2.

The interconnect layers corresponding to the select gate lines SGD and SGS may be configured by one layer or more, and there is no limit to the number of the interconnect layers. Furthermore, dummy memory cell transistors MT may be included in the NAND strings 115. In this case, a dummy word line WL may be provided between, for example, the select gate line SGS and the word line WL0, or the select gate line SGD and the word lines WL15.

In addition, in the same manner as the memory pillar MP, the block insulating film 13, the electric charge accumulation layer 14, and the tunnel insulating film 15 are sequentially stacked on a side surface of the slit SHE, and the inside of the slit SHE is filled with a material of the semiconductor layer 16. Hence, the dummy line DSL includes the semiconductor layer 16, and the block insulating film 13, the electric charge accumulation layer 14, and the tunnel insulating film 15 which are provided on the side surface of the semiconductor layer 16, in the same manner as the memory pillar MP.

The slit SHE, that is, a bottom portion of the dummy line DSL may reach the word lines WL of a lower layer. For example, the slit SHE may penetrate the word line WL15 to reach the word line WL14. In this case, the word lines WL14 and WL15 and the select gate lines SGD are not electrically connected to each other because the block insulating film 13, the electric charge accumulation layer 14, and the tunnel insulating film 15 are formed on the side surface of the slit SHE.

Furthermore, the semiconductor layer 16 may not be formed in the inside of the slit SHE. For example, if a width of the slit SHE is small, the inside of the slit SHE may be filled with a certain material after the block insulating film 13, the electric charge accumulation layer 14, and the tunnel insulating film 15 are formed.

In addition, a contact plug (hereinafter, referred to as a source line contact LI) of a line shape is disposed in the first direction D1. The source line contact LI is formed of, for example, polycrystalline silicon. In addition, a bottom surface of the source line contact LI is connected to the $n^+$-type diffusion layer 12, and an upper surface of the source line contact LI is connected to the source line SL (not illustrated).

Next, a cross-sectional structure of the region RB in which the extended portions of the select gate lines SGD and SGS and the word lines WL are formed will be described.

As illustrated in FIG. 7 and FIG. 8, holes HR (dummy pillars DP are formed so as to penetrate the interconnect layers corresponding to the select gate lines SGD and SGS and the word lines WL and reach the p-type well 11. In the same manner as the memory hole MH and the slit SHE, the block insulating film 13, the electric charge accumulation layer 14, and the tunnel insulating film 15 are sequentially stacked on a side surface of the inside of the hole HR, and the inside of the hole HR is filled with a material of the semiconductor layer 16. That is, in the same manner as the memory pillar MP and the dummy line DSL, the dummy pillar DP includes the semiconductor layer 16, and the block insulating film 13, the electric charge accumulation layer 14, and the tunnel insulating film 15 provided on the side surface of the semiconductor layer 16.

In addition, as illustrated in FIG. 9, each of the contact plugs CC is provided so as to be in contact with an upper surface of the extended portion of any one of the select gate lines SGD and SGS and the word lines WL. In addition, upper surfaces of the contact plugs CC are connected to the above wires (not illustrated). More specifically, the select gate lines SGS_0 to SGS_3 are connected in common to the wires located above, through the contact plugs CC different from each other. The select gate lines SGD0_0 to SGD0_3 and the select gate lines SGD1_0 to SGD1_3 are the same as the select gate lines SGS. In addition, the word lines WL0 to WL15 are connected to other of the wires through the contact plugs CC different from each other.

A bottom surface of the dummy pillar DP (hole HR) may not be in contact with a silicon substrate so long as the dummy pillar DP penetrates the select gate line SGS.

Furthermore, the select gate lines SGD and SGS which are configured by multiple layers may be connected in common to one contact plug CC. For example, the select gate lines SGS_0 to SGS_3 of four layers are connected to the contact plug CC which reaches the select gate line SGS_0 through the select gate lines SGS_1 to SGS_3, and thereby the select gate lines SGS_0 to SGS_3 of four layers may be connected in common to one contact plug CC. The select gate lines SGD0_0 to SGD0_3 and SGD1_0 to SGD1_3 are also the same as above.

2. Method of Forming Memory Cell Array

Next, a method of forming the memory cell array 111 will be described with reference to FIG. 10 to FIG. 31. FIG. 10, FIG. 14, FIG. 17, FIG. 20, FIG. 24, FIG. 25, FIG. 27, and FIG. 29 to FIG. 31 are cross-sectional views of the memory cell array 111 taken along line I-I illustrated in FIG. 4. FIG. 11, FIG. 15, FIG. 18, and FIG. 21 are cross-sectional views of the memory cell array 111 taken along line II-II illustrated in FIG. 4. FIG. 12, FIG. 16, FIG. 19, FIG. 22, FIG. 26, and FIG. 28 are cross-sectional views of the memory cell array 111 taken along line III-III illustrated in FIG. 4. In addition, FIG. 13 and FIG. 19 illustrate plan views of the string units SU0 to SU4. In the method according to the present embodiment, layers corresponding to the interconnect layers of the word lines WL and the select gate lines SGD and SGS are formed of a silicon nitride film (hereinafter, referred to as a "SiN film"), then the SiN film is removed, and then the portions in which SiN is removed are filled with tungsten (W). The material for layers is not limited to an silicon nitride film, may include silicon and nitride as configuration elements, and an insulating material with Si—N bond, for example, a silicon nitride film may be used.

Figure 10:
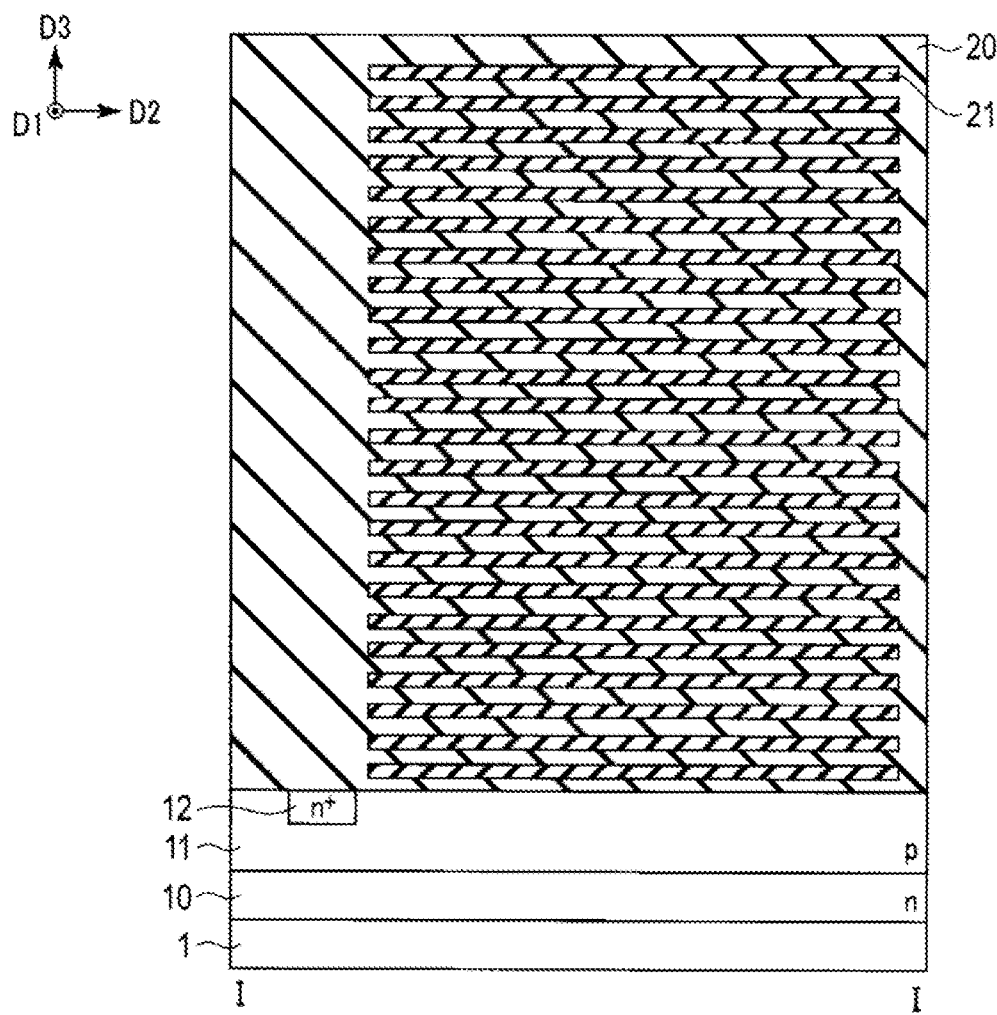
FIG. 10 is a cross-sectional view of the string group taken along line I-I to illustrate a fabrication process of the semiconductor memory device according to the embodiment.
Figure 11:
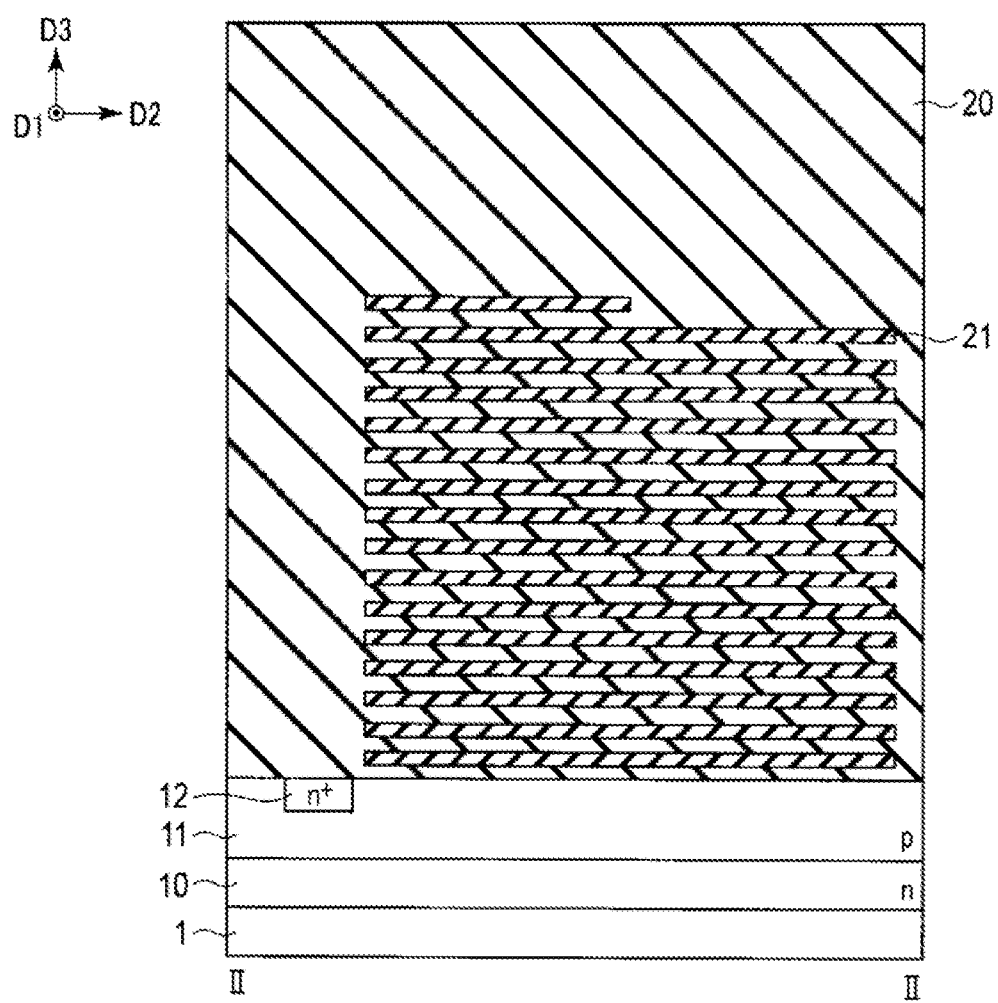
FIG. 11 is a cross-sectional view of the string group taken along line II-II to illustrate the fabrication process shown in FIG. 10.
Figure 12:
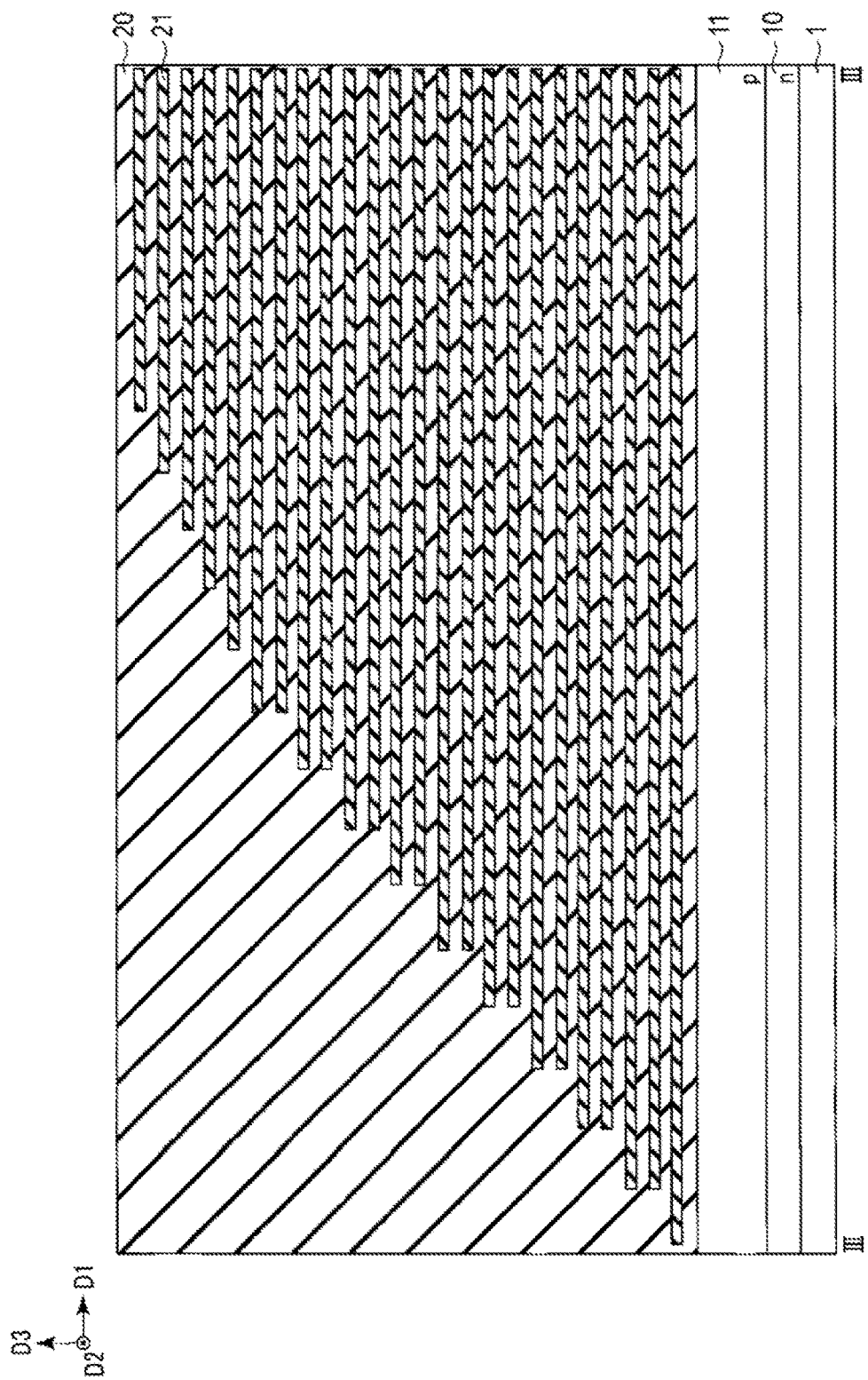
FIG. 12 is a cross-sectional view of the string group taken along line III-III to illustrate the fabrication process shown in FIG. 10.
Figure 13:
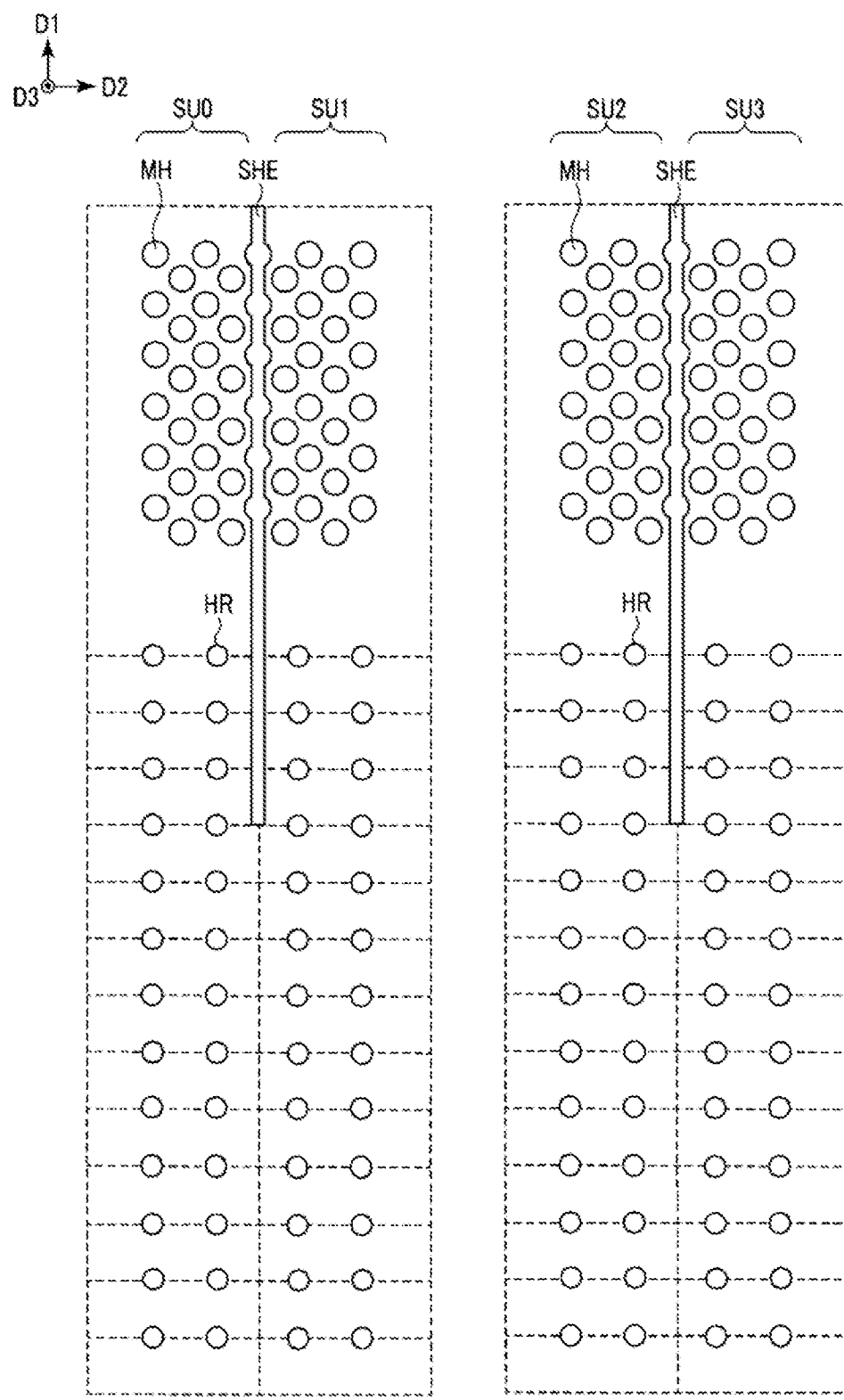
FIG. 13 is a plan view of string groups to illustrate a fabrication process of the semiconductor memory device according to the embodiment.
Figure 14:
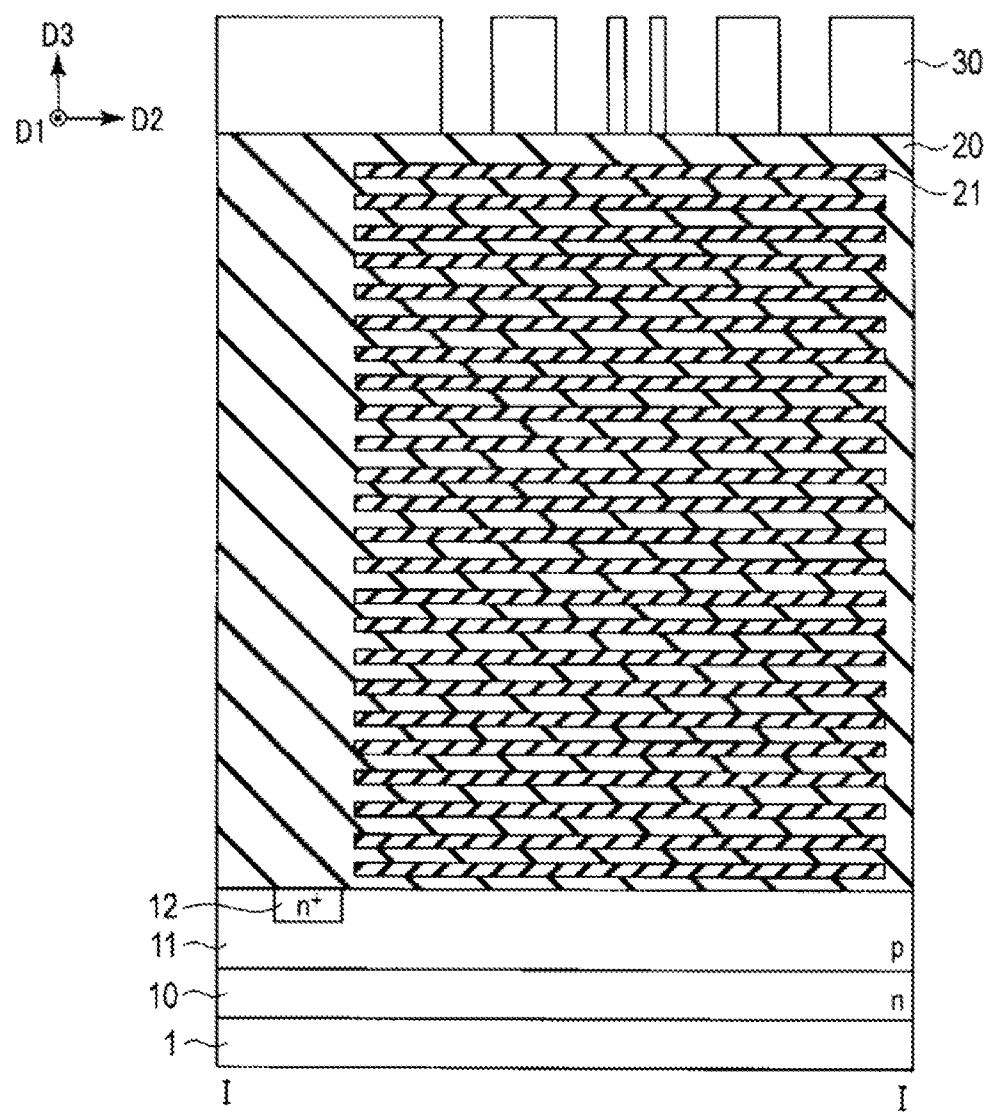
FIG. 14 is a cross-sectional view of the string group taken along line I-I in FIG. 4 to illustrate the fabrication process shown in FIG. 13.
Figure 15:
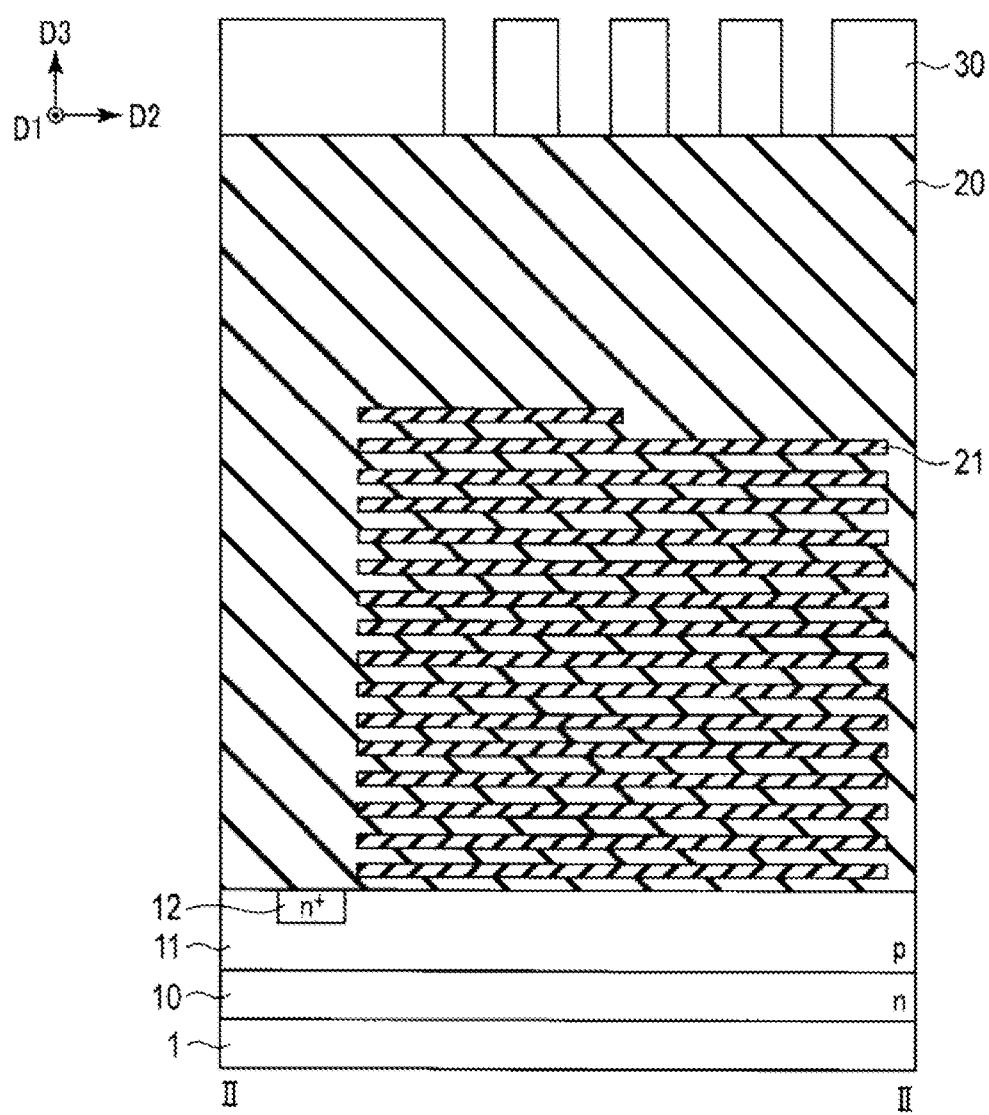
FIG. 15 is a cross-sectional view of the string group taken along line II-II in FIG. 4 to illustrate the fabrication process shown in FIG. 13.
Figure 16:
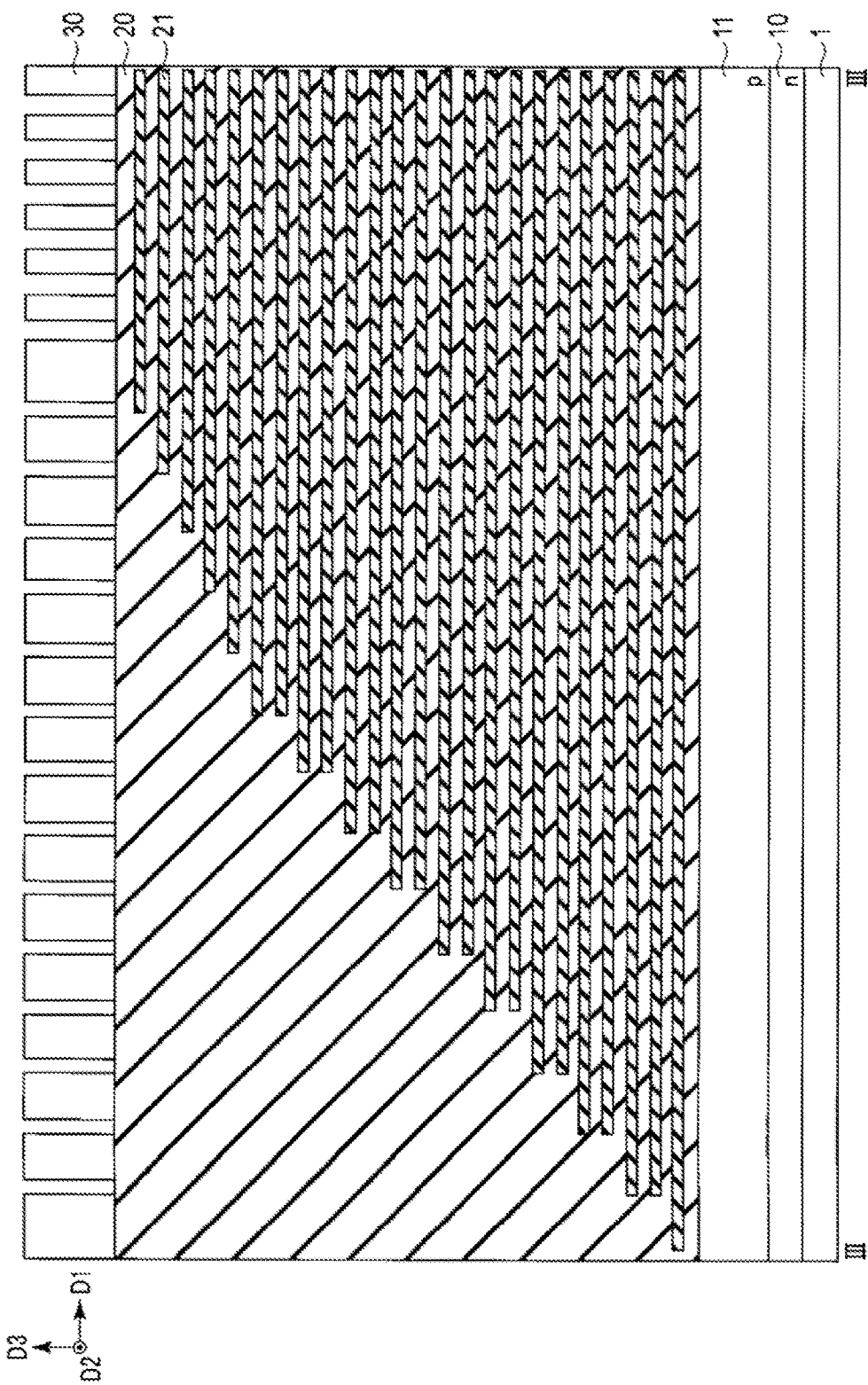
FIG. 16 is a cross-sectional view of the string group taken along line III-III in FIG. 4 to illustrate the fabrication process shown in FIG. 13.

First, as illustrated in FIG. 10 to FIG. 12, multiple insulating layers (for example, $SiO_2$ film) 20 and multiple insulating layers (for example, SiN film) 21 are alternately stacked on an upper surface of the semiconductor substrate 1, and a stepwise portion is formed by the insulating layer 21. More specifically, first, the insulating layers 20 are formed on the semiconductor substrate 1, and the insulating layers 21 of 24 layers corresponding to the select gate lines SGS of four layers, the word lines WL of 16 layers, and the select gate lines SGD of four layer and the insulating layers 20 are alternately stacked on an upper surface thereof. Then, first and second stepwise portions are formed by the select gate lines SGD and SGS and the word lines WL which are described above, using the insulating layers 21. Thereafter, for example, the insulating layers 20 are formed so as to cover the surface, and the surface is planarized by using, for example, chemical mechanical polishing (CMP).

Subsequently, as illustrated in FIG. 13 to FIG. 16, a resist 30 is applied to surfaces of the insulating layers 20, and mask patterns of the memory holes MH, the slits SHE, and the holes HR are collectively formed by photolithography.

Figure 17:
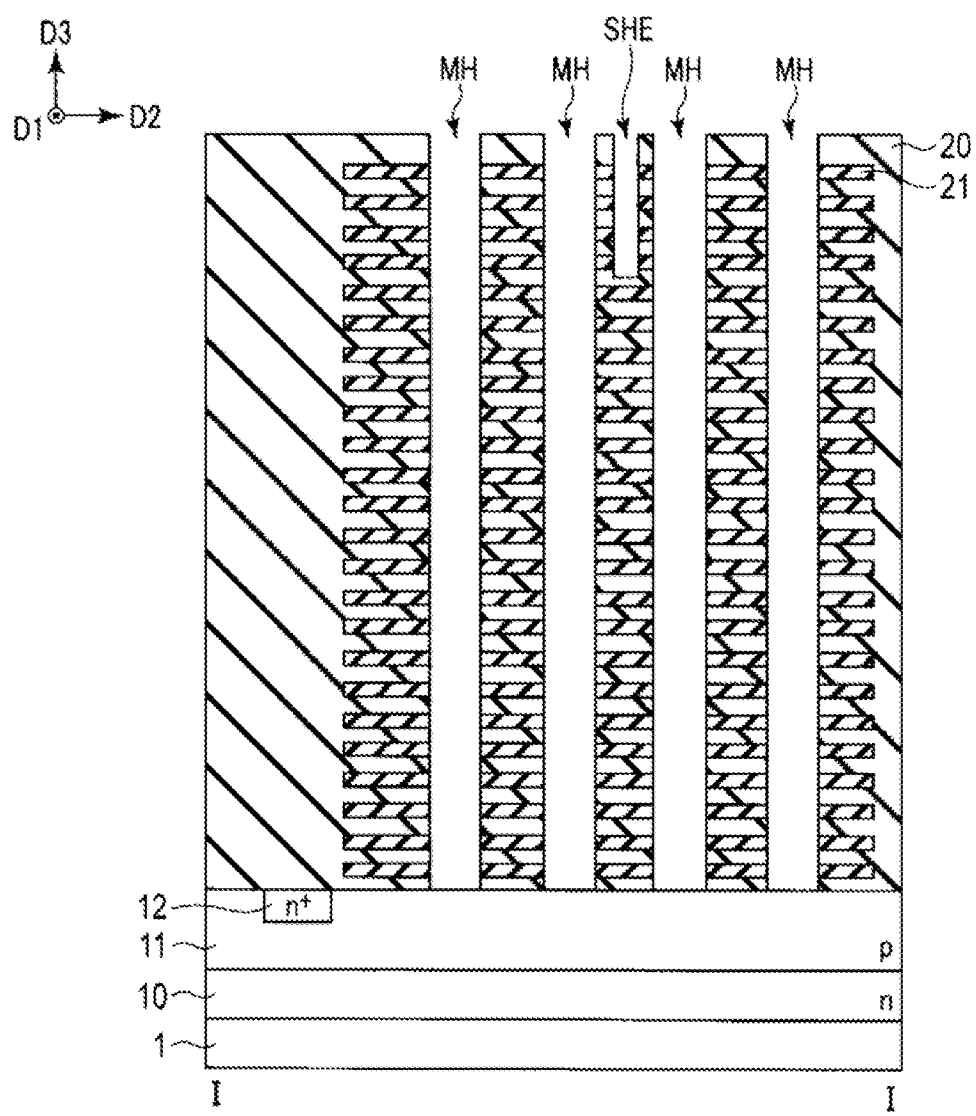
FIG. 17 is a cross-sectional view of the string group taken along line I-I in FIG. 4 to illustrate a fabrication process of the semiconductor memory device according to the embodiment.
Figure 18:
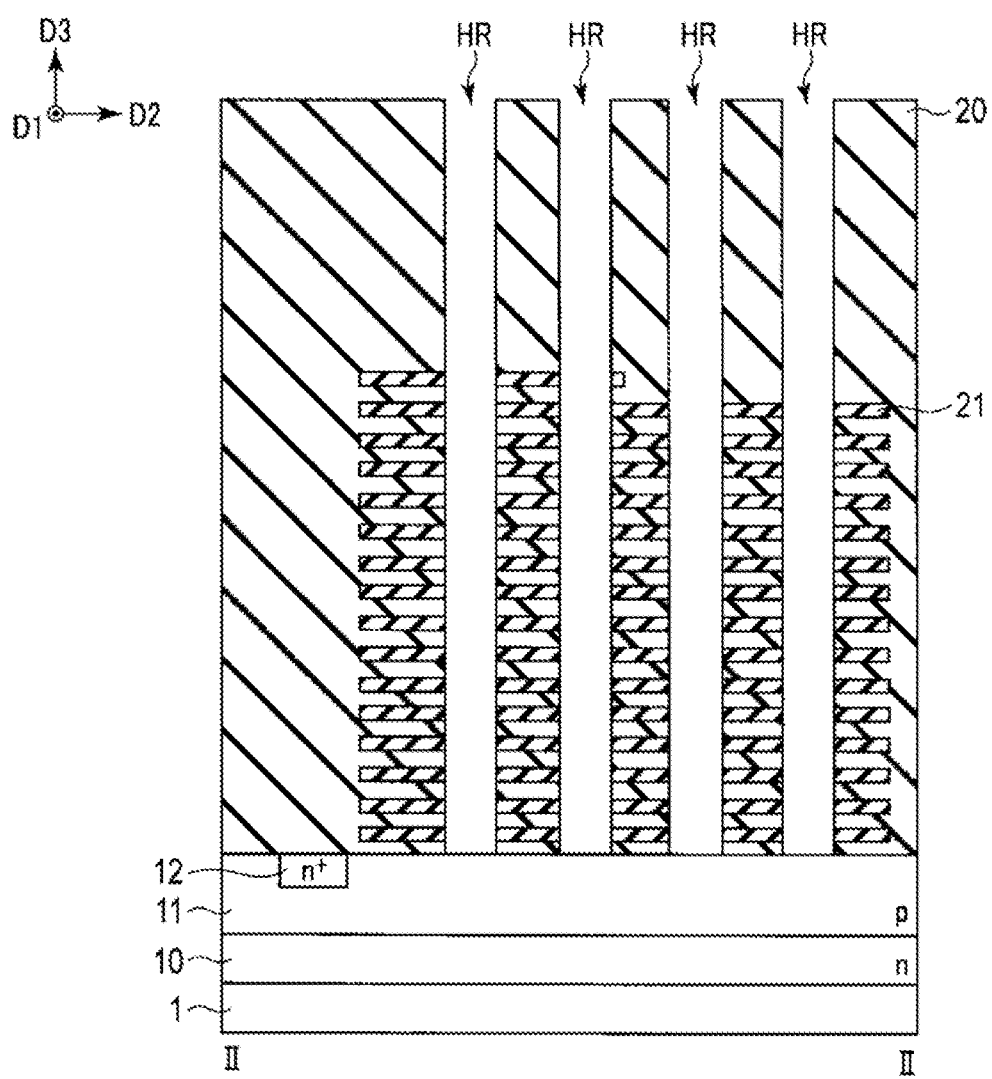
FIG. 18 is a cross-sectional view of the string group taken along line II-II in FIG. 4 to illustrate the fabrication process shown in FIG. 17.
Figure 19:
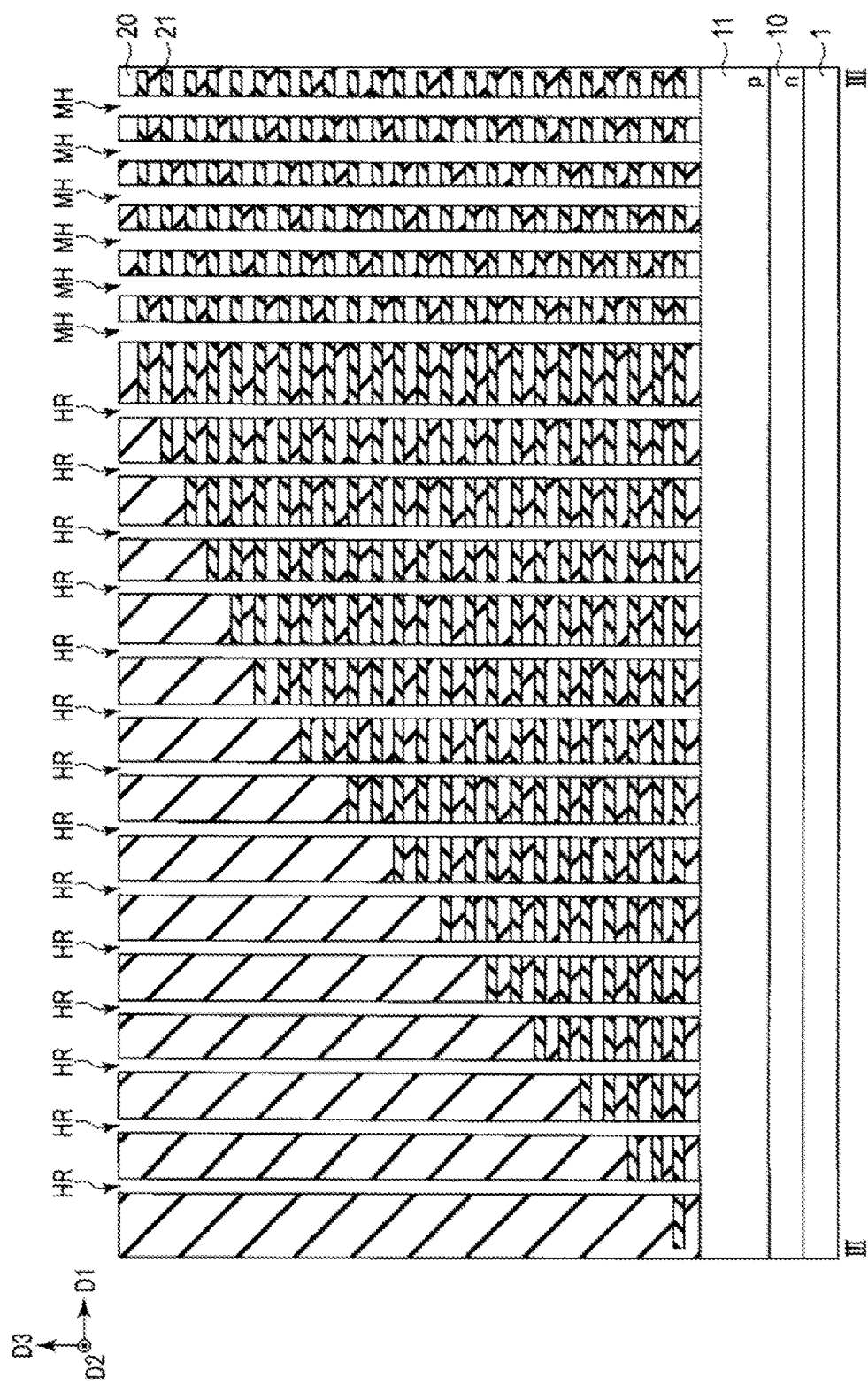
FIG. 19 is a cross-sectional view of the string group taken along line III-III in FIG. 4 to illustrate the fabrication process shown in FIG. 17.

Subsequently, as illustrated in FIG. 17 to FIG. 19, the memory holes MH, the slits SHE, and the holes HR are collectively formed by etching the insulating layers, using the aforementioned mask patterns. Thereafter, the resist 30 is removed by wet peeling or ashing.

More specifically, the memory holes MH and the holes HR are formed so as to reach the p-type well 11. Meanwhile, it is preferable that the slit SHE separates the insulating layers 21 of four layers of an uppermost layer corresponding to the select gate lines SGD for each of the string units SU, and a groove of the slit may not reach the p-type well 11. It is preferable that the slit SHE has a depth which does not reach the insulating layer 21 of a fifth layer from the uppermost layer corresponding to the word line WL15.

A groove width of the slit SHE may be smaller than diameters of the memory hole MH and the hole HR. If the groove width of the slit SHE may be smaller than the diameters of the memory hole MH and the hole HR, an etching late of the slit SHE would become lower than etching rates of the memory hole MH and the hole HR. In addition, for example, optimal etching conditions of the memory hole MH and the hole HR, and that of the slit SHE are different from each other due to a difference between a hole shape and a slit shape. Accordingly, if the slit SHE is etched with an optimal etching condition for the hole shape, the etching rate of the slit SHE can be lower than the etching rates of the memory hole MH and the hole HR. Due to this, the groove depth of the slit SHE can be smaller than the depth of the memory hole MH or the hole HR.

Figure 20:
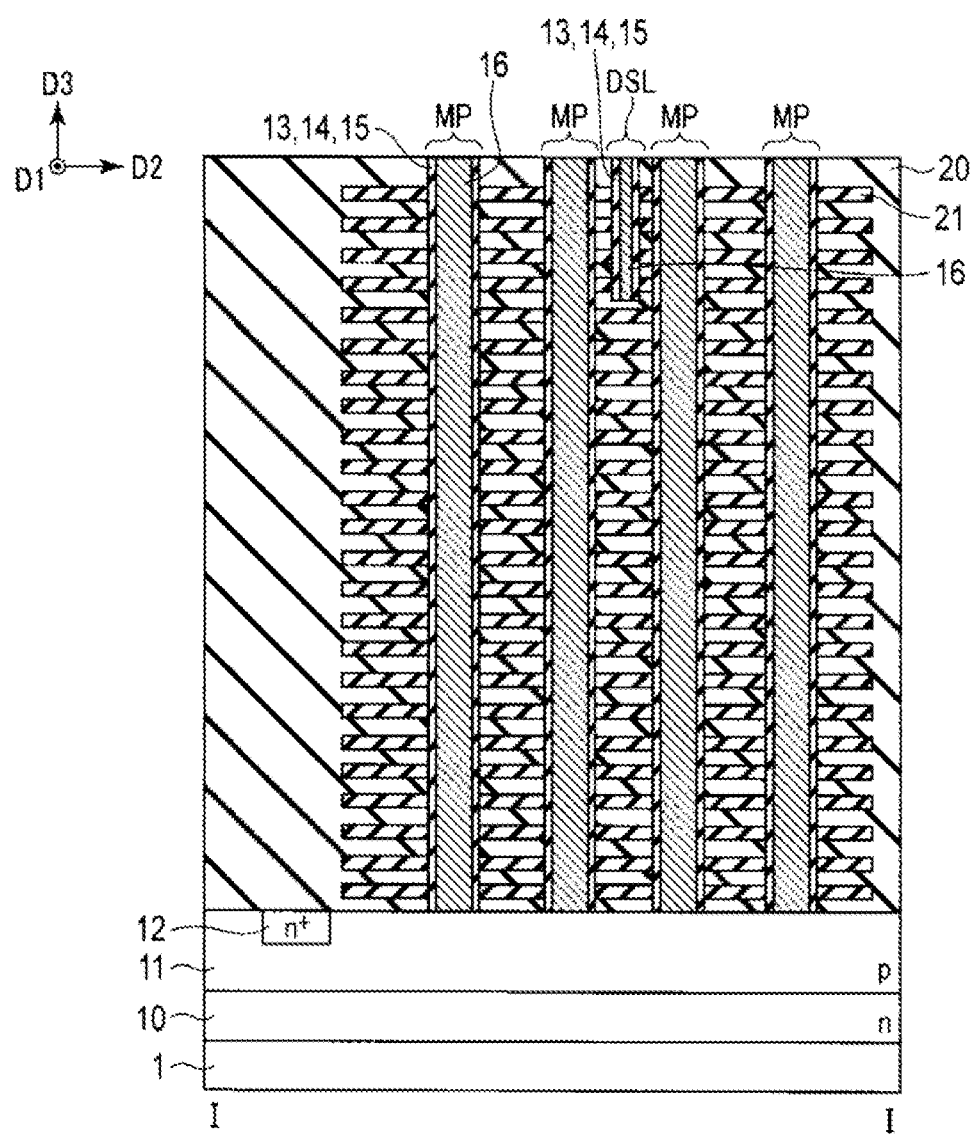
FIG. 20 is a cross-sectional view of the string group taken along line I-I in FIG. 4 to illustrate a fabrication process of the semiconductor memory device according to the embodiment.
Figure 21:
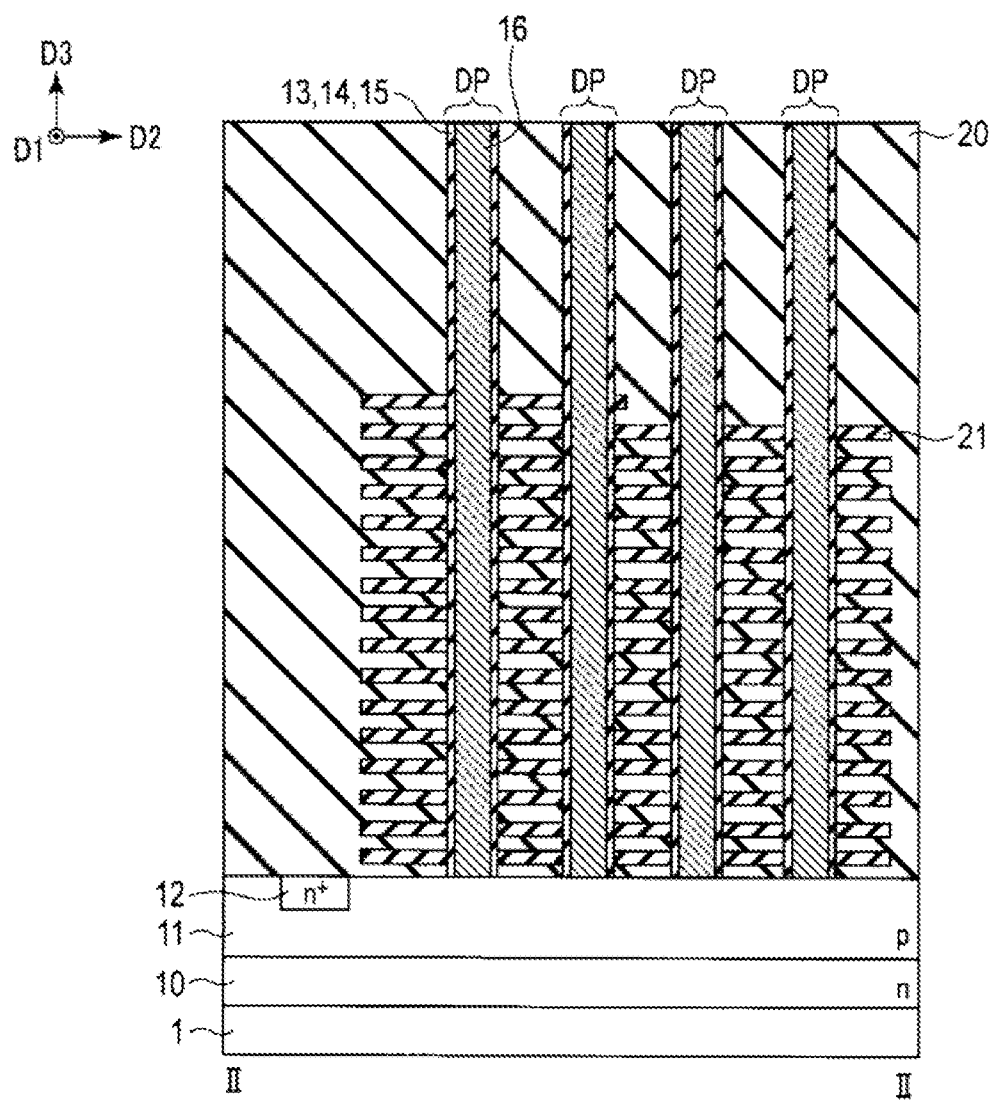
FIG. 21 is a cross-sectional view of the string group taken along line II-II in FIG. 4 to illustrate the fabrication process shown in FIG. 20.
Figure 22:
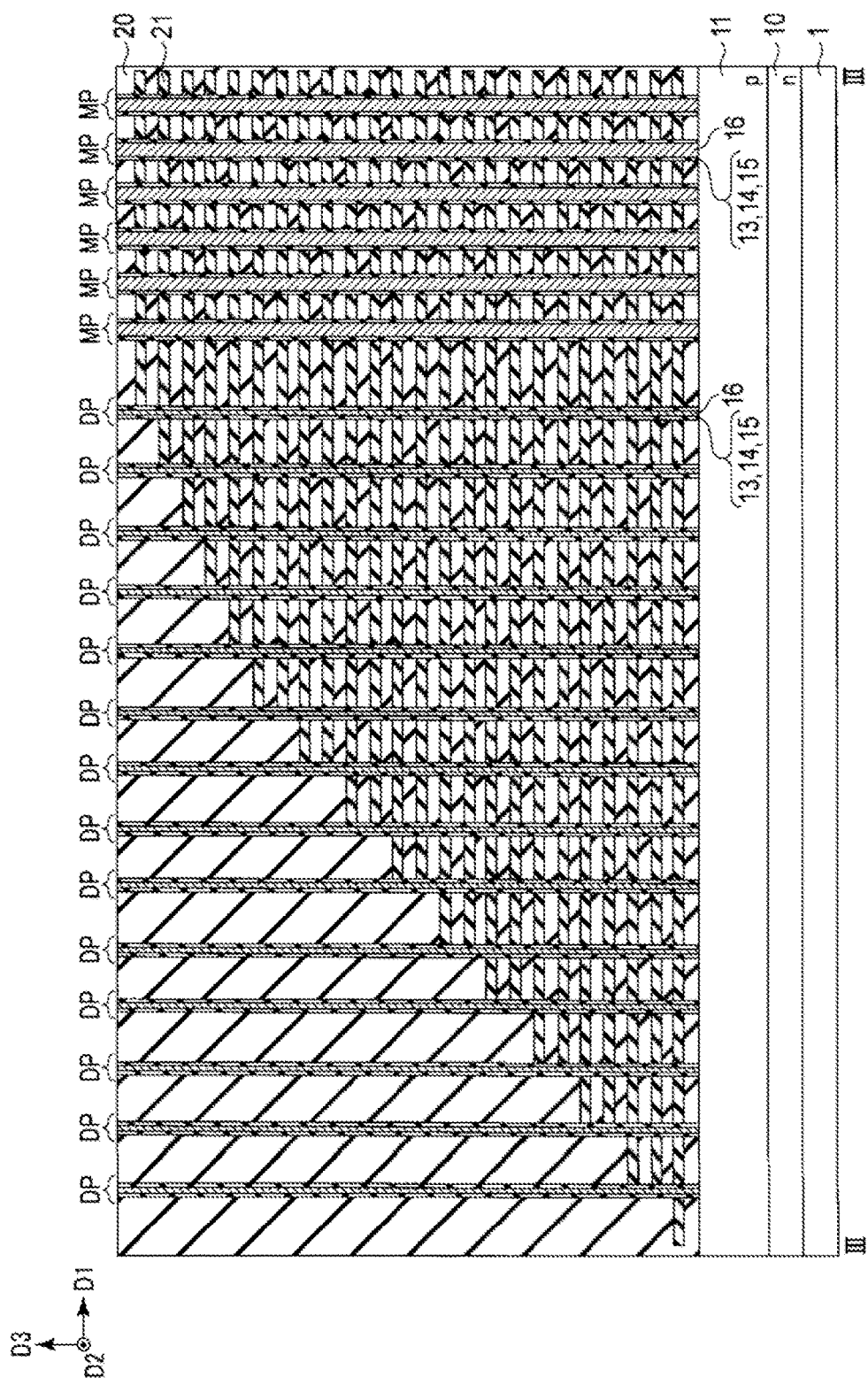
FIG. 22 is a cross-sectional view of the string group taken along line III-III in FIG. 4 to illustrate the fabrication process shown in FIG. 20.

Next, as illustrated in FIG. 20 to FIG. 22, the block insulating film 13, the electric charge accumulation layer 14, the tunnel insulating film 15, and the semiconductor layer 16 are sequentially formed, and fill the memory holes MH, the holes HR, and the slits SHE. Then, the block insulating film 13, the electric charge accumulation layer 14, the tunnel insulating film 15, and the semiconductor layer 16 which are formed on the insulating layer 20 are removed by etching or CMP, and the memory pillar MP, the dummy pillar DP, and the dummy line DSL are formed.

Figure 23:
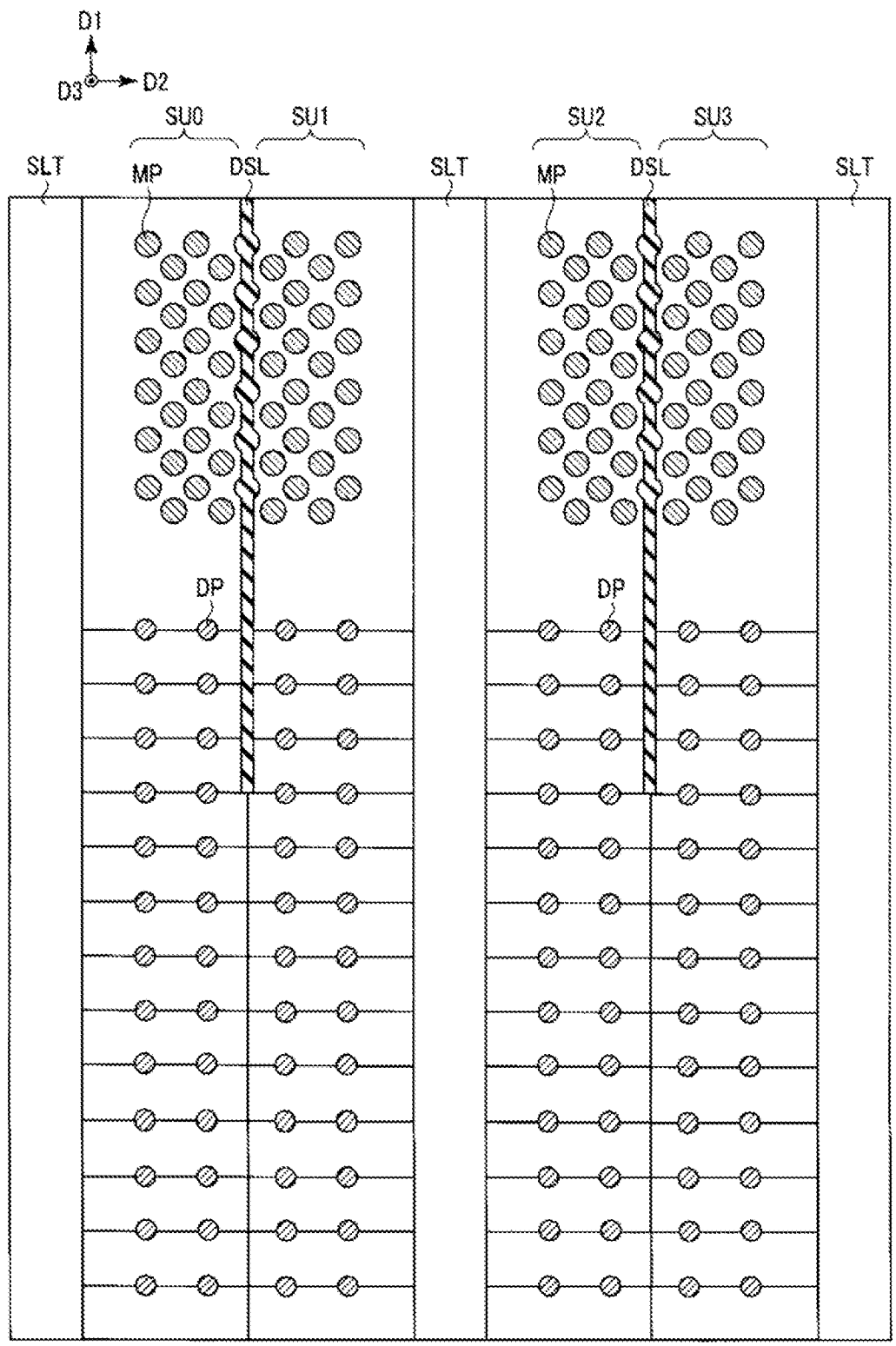
FIG. 23 is a plan view of the string group to illustrate a fabrication process of the semiconductor memory device according to the embodiment.
Figure 24:
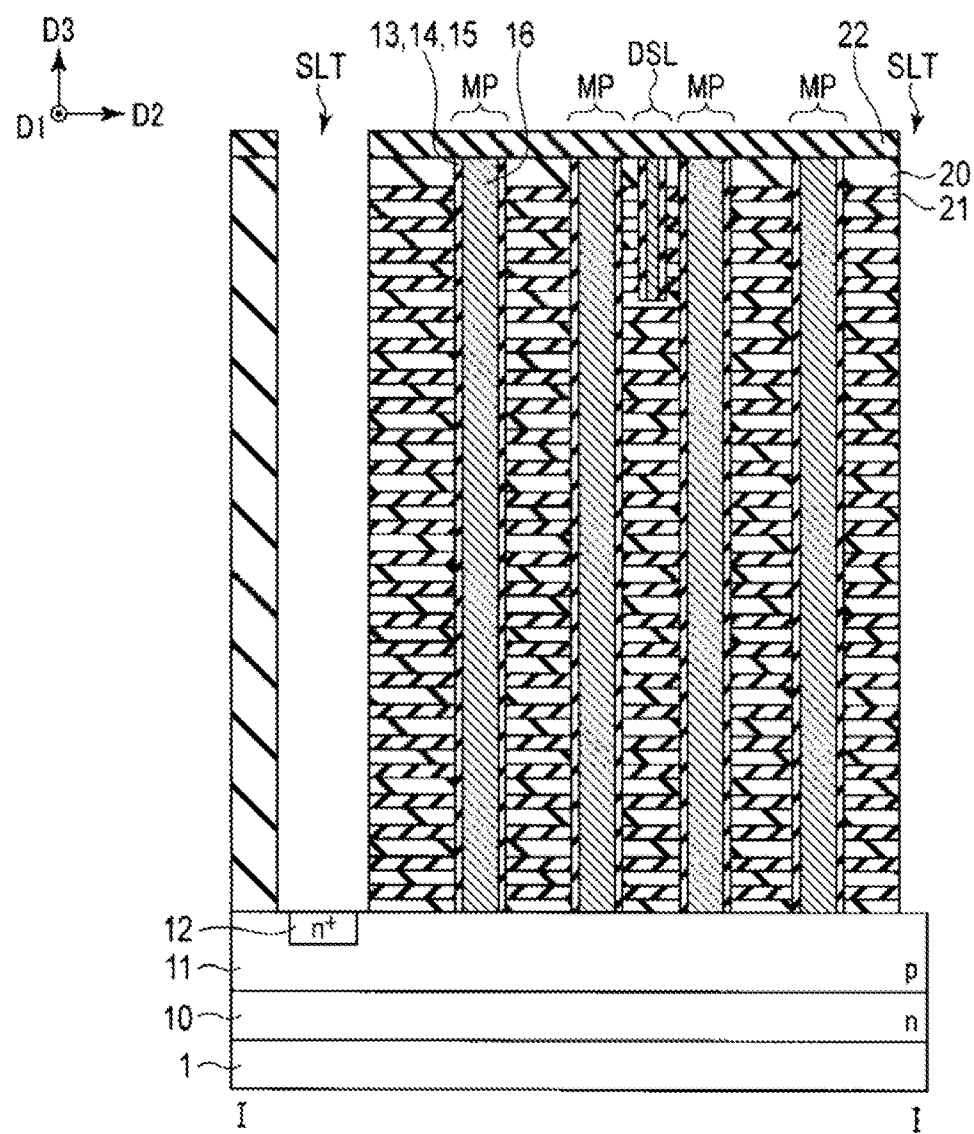
FIG. 24 is a cross-sectional view of the string group taken along line I-I in FIG. 4 to illustrate the fabrication process shown in FIG. 23.

Subsequently, as illustrated in FIG. 23 and FIG. 24, an insulating layer (for example, $SiO_2$ film) 22 is formed to cover surfaces of the memory pillar MP, the dummy pillar DP, and the dummy line DSL, and thereafter, a slit SLT is formed in the first direction D1 such that an end portion (side surface) of the insulating layer 21 is exposed in the second direction D2 by using photolithography technique and etching technique.

Figure 25:
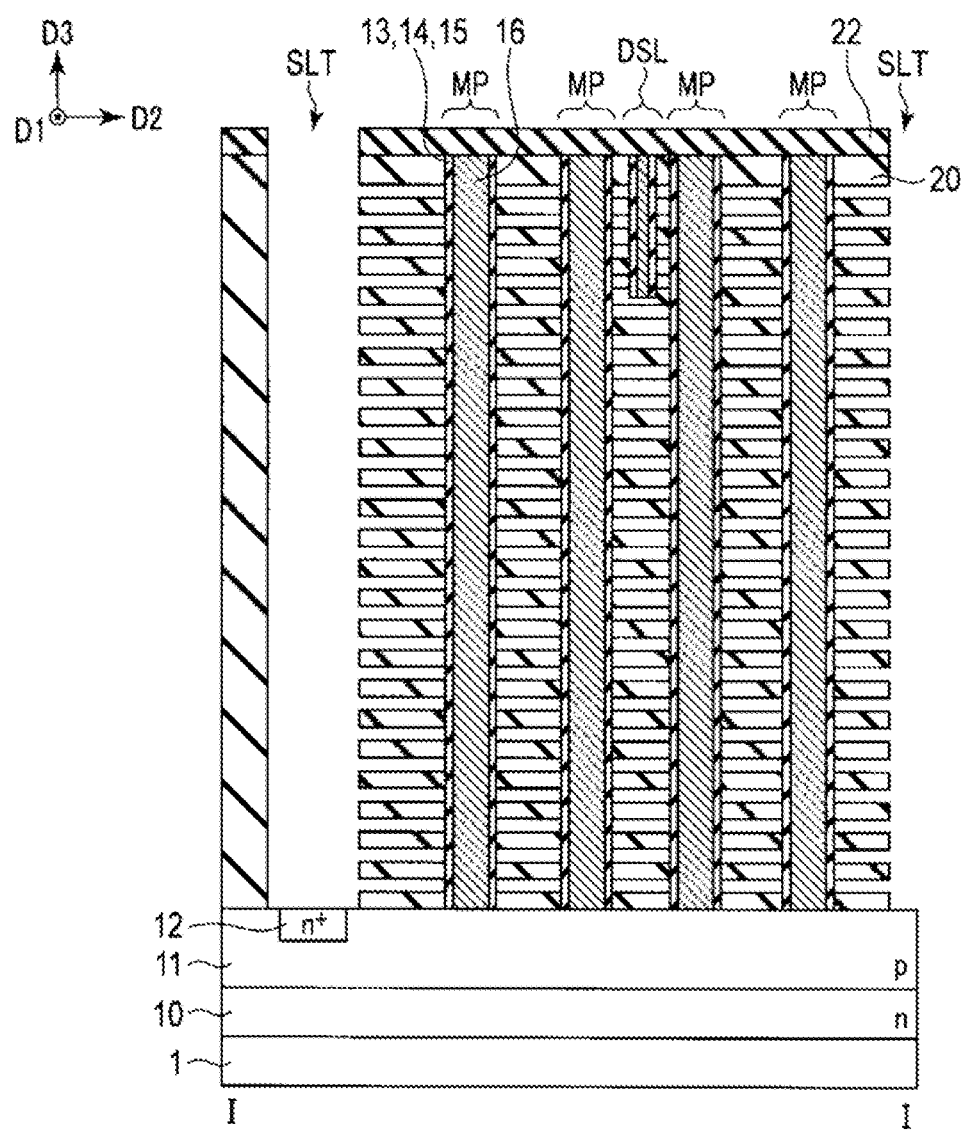
FIG. 25 is a cross-sectional view of the string group taken along line I-I in FIG. 4 to illustrate the fabrication process shown in FIG. 23.
Figure 26:
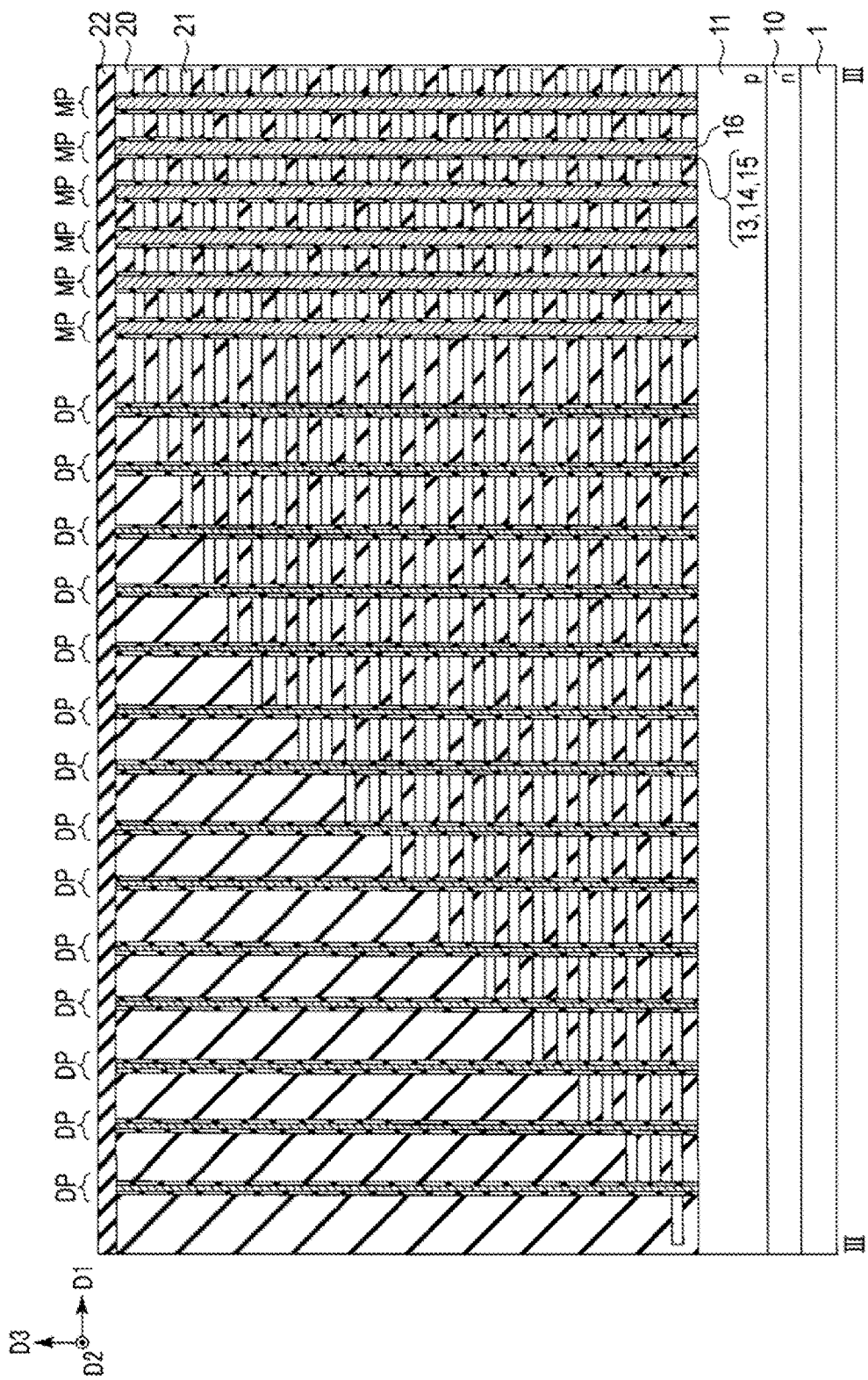
FIG. 26 is a cross-sectional view of the string group taken along line III-III in FIG. 4 to illustrate the fabrication process shown in FIG. 23.

Subsequently, as illustrated in FIG. 25 and FIG. 26, the insulating layer 21 (for example, SiN film) is removed by wet etching in which a phosphoric acid solution of, for example, approximately 100° C. to 200° C. is used. More specifically, the insulating layer 21 is etched by making an etching solution penetrate from a slit SLT. As a result, gaps are formed in the string unit SU (hereinafter, referred to as "gap portions"). At this time, the memory pillar MP and the dummy pillar DP function as columns which support, such that the stacked insulating layers 20 do not change due to the gap portions.

Figure 27:
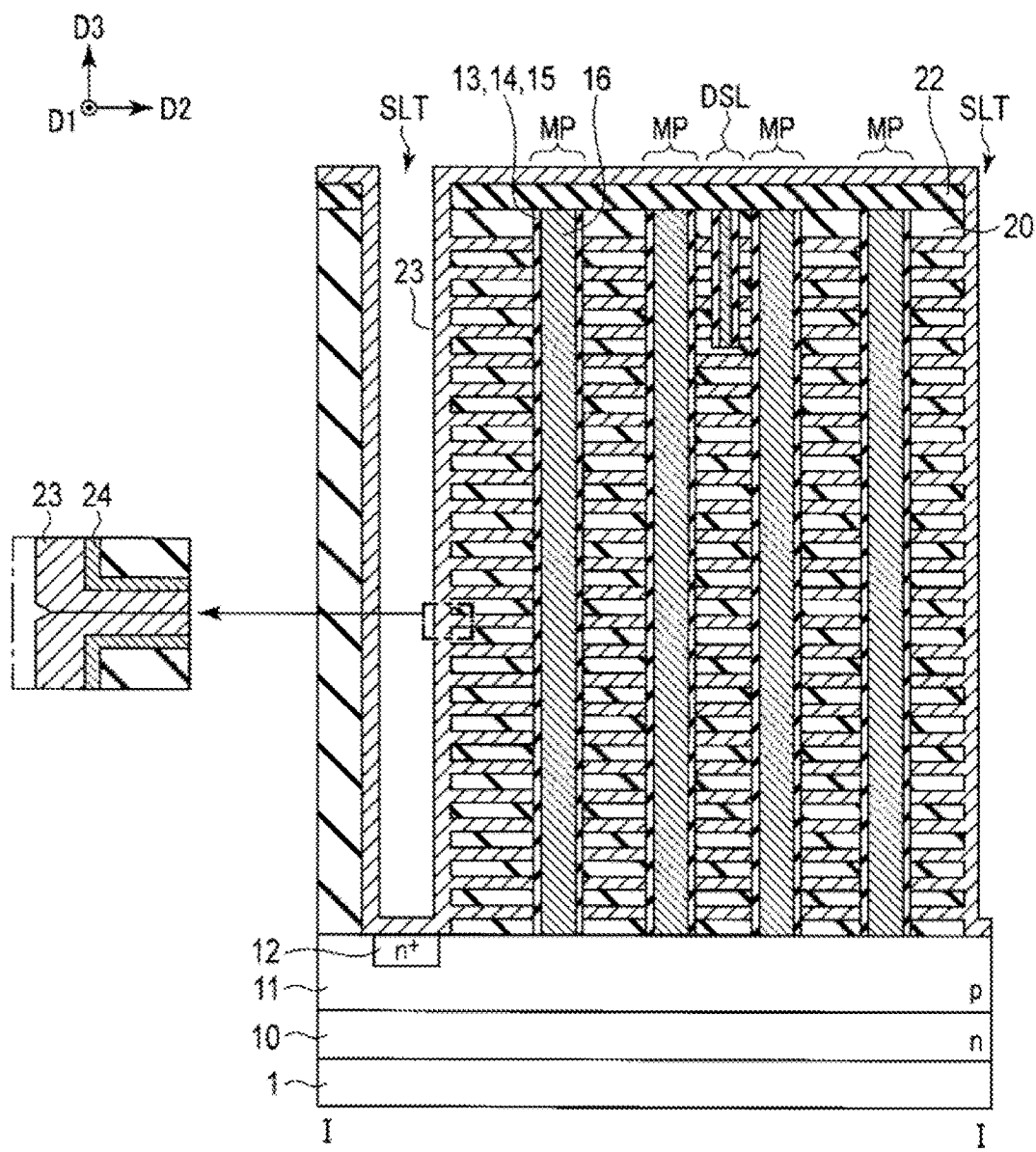
FIG. 27 is a cross-sectional view of the string group taken along line I-I in FIG. 4 to illustrate a fabrication process of the semiconductor memory device according to the embodiment.
Figure 28:
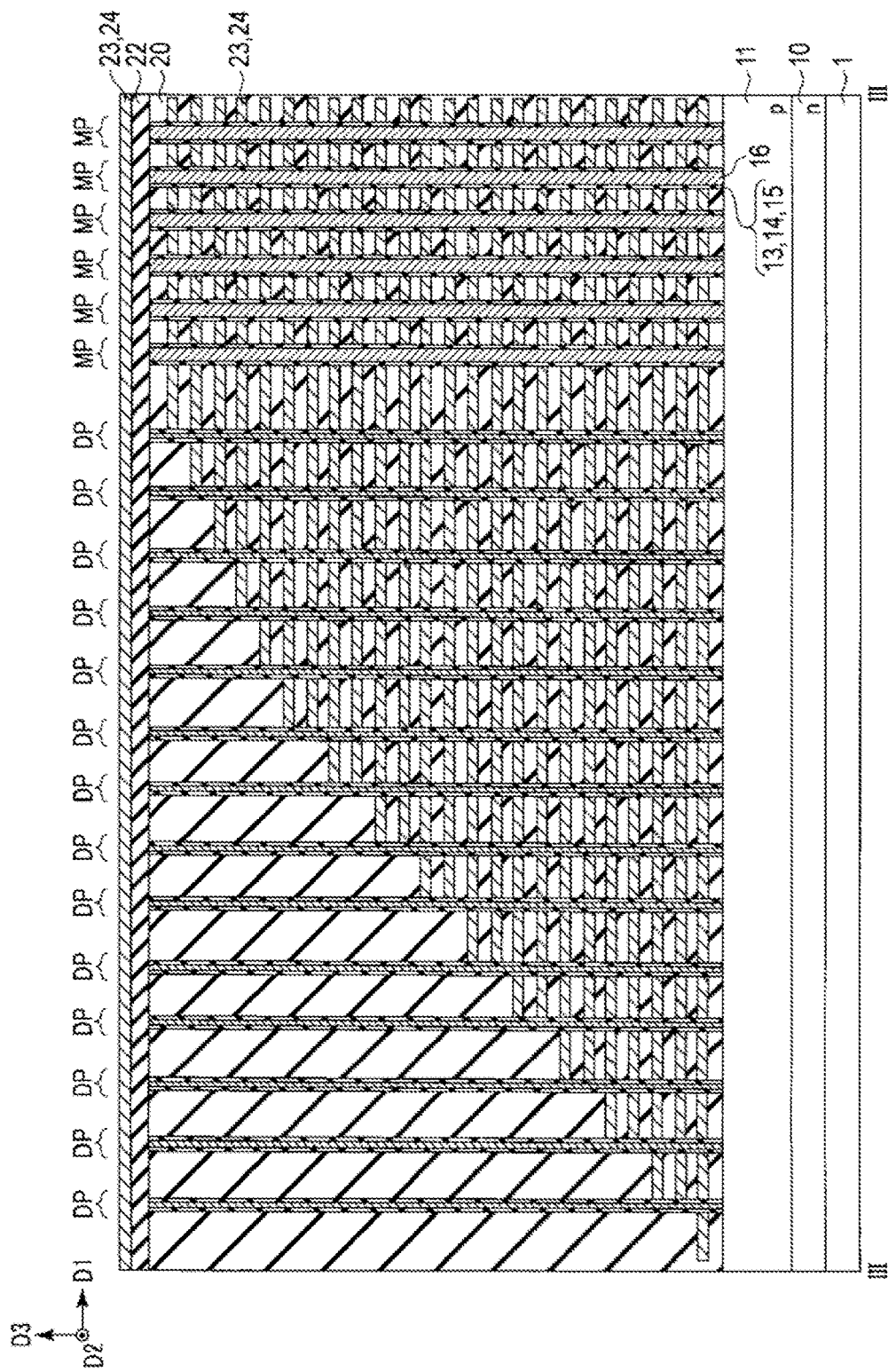
FIG. 28 is a cross-sectional view of the string group taken along line III-III in FIG. 4 to illustrate the fabrication process shown in FIG. 27.

Subsequently, as illustrated in FIG. 27 and FIG. 28, a barrier metal layer 24 (for example, titanium nitride (TiN)) and a metal layer 23 (for example, tungsten) are formed using, for example, a chemical vapor deposition (CVD) method, and fill the gap portions in the string unit SU. At this time, a thickness of the metal layer 23 is set to the extent that the metal layer fills the gap portion and does not fully fill the slit SLT. Here, titanium nitride is used for the barrier metal layer 24 and tungsten is used for the metal layer 23, but materials of the barrier metal layer 24 and the metal layer 23 are not limited to this, and any type of conductive materials may be used therefor.

Figure 29:
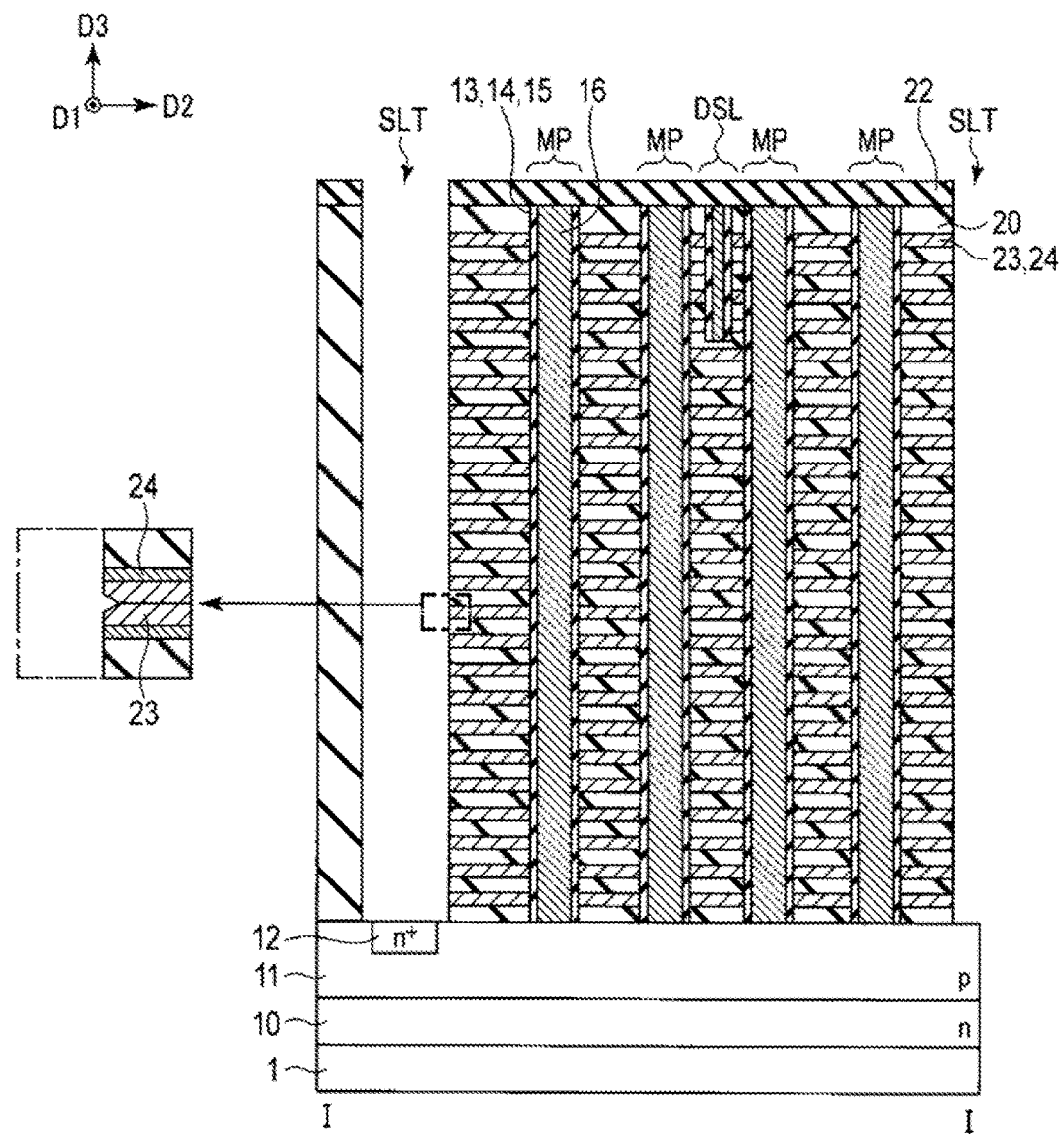
FIG. 29 is a cross-sectional view of the string group taken along line I-I in FIG. 4 to illustrate a fabrication process of the semiconductor memory device according to the embodiment.

Subsequently, as illustrated in FIG. 29, the metal layer 23 and the barrier metal layer 24 in the slit SLT are removed by etching. By doing so, the metal layer 23 and the barrier metal layer 24 of each interconnect layer are separated in each interconnect layer, and thereby the select gate lines SGD and SGS and the word lines WL are formed.

Figure 30:
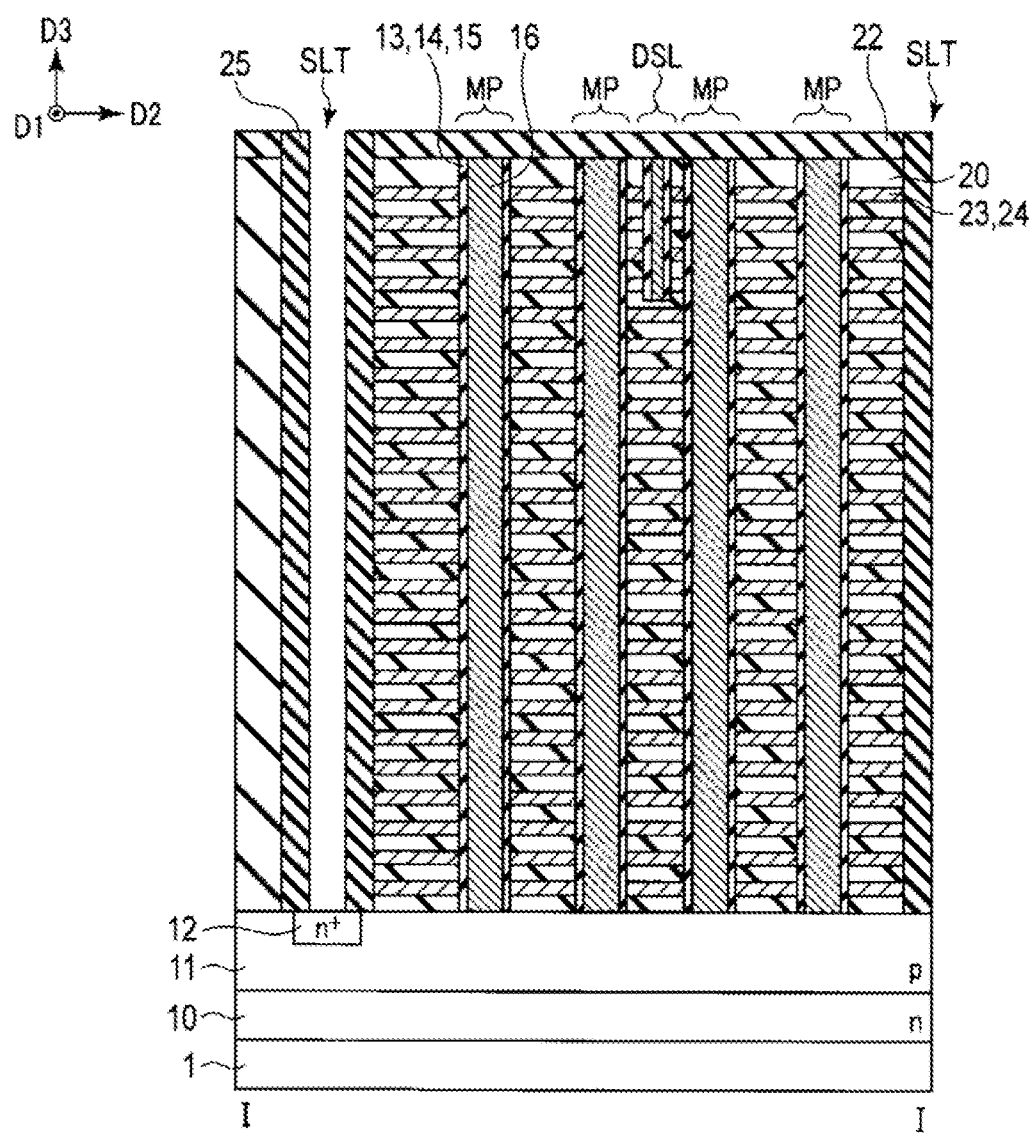
FIG. 30 is a cross-sectional view of the string group taken along line I-I in FIG. 4 to illustrate a fabrication process of the semiconductor memory device according to the embodiment.

Subsequently, as illustrated in FIG. 30, a side wall is formed by an insulating layer 25 (for example, $SiO_2$ film) in the slit SLT. More specifically, after the insulating layer 25 is formed, etchback of the insulating layer 25 is performed by dry etching. By doing so, the insulating layer 25 which is formed on a surface of the insulating layer 22 and formed on a bottom portion of the slit SLT is removed, and a side wall is formed on a side surface of the slit SLT by the insulating layer 25.

Figure 31:
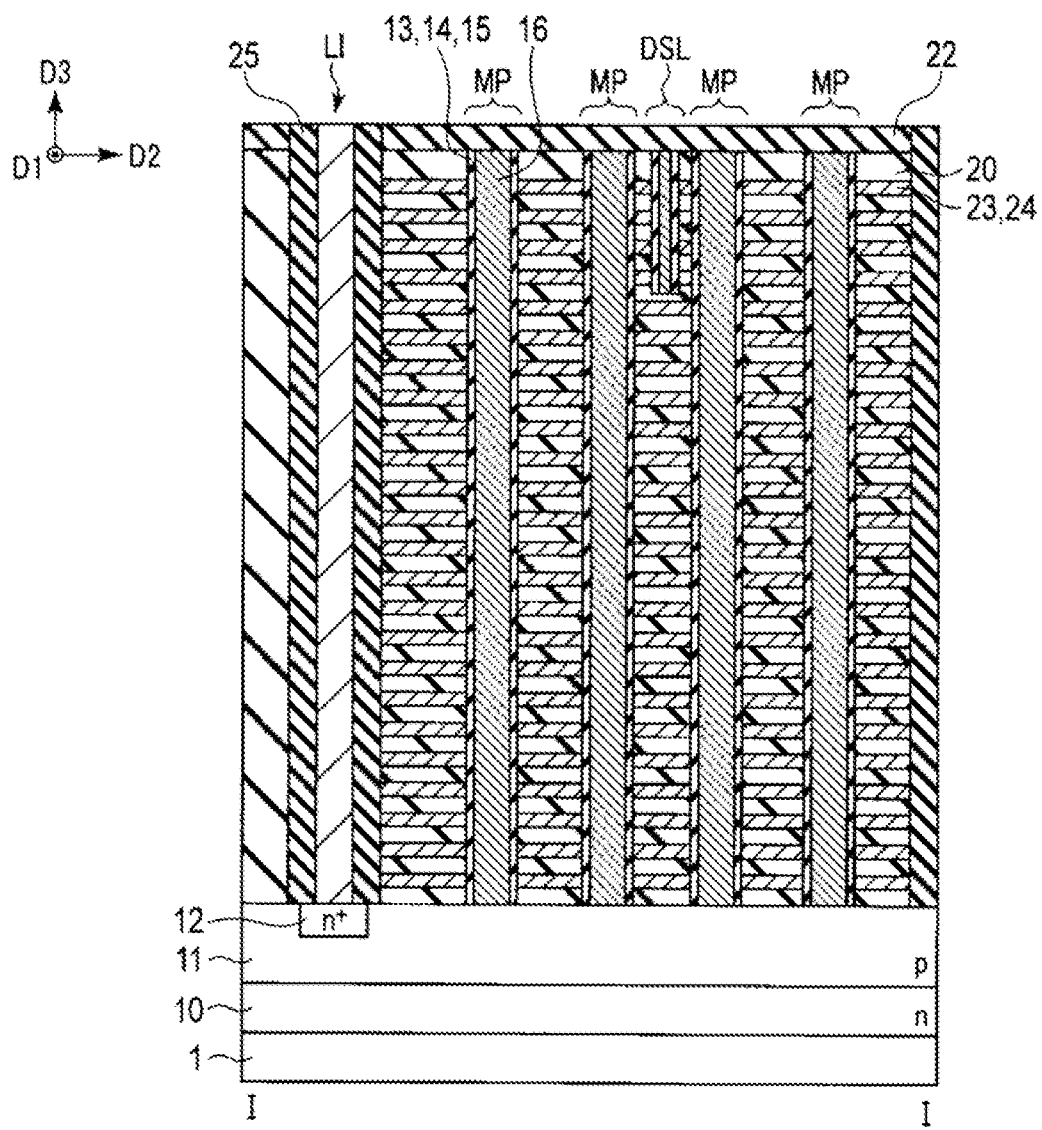
FIG. 31 is a cross-sectional view of the string group taken along line I-I in FIG. 4 to illustrate a fabrication process of the semiconductor memory device according to the embodiment.

Subsequently, as illustrated in FIG. 31, the inside of the slit SLT is filled with, for example, a material of a semiconductor layer. Then, the semiconductor layer on the surface of the insulating layer 22 is removed, and thereby the source contact LI is formed.

3. Advantage of the Present Embodiment

In the present embodiment, the memory hole MH, the hole HR, and the slit SHE can be filled with the same material. More specifically, the memory hole MH, the hole HR, and the slit SHE can be simultaneously filled with a material of the block insulating film 13, the electric charge accumulation layer 14, the tunnel insulating film 15, and the semiconductor layer 16. Hence, the memory pillar MP, the dummy pillar DP, and the dummy line DSL can be collectively formed, and thus, it is possible to reduce the number of fabrication processes. Hence, it is possible to reduce a fabrication period, and to reduce fabrication cost.

Furthermore, in the present embodiment, the memory hole MH, the hole HR, and the slit SHE can be collectively formed. More specifically, mask patterns of the memory hole MH, the hole HR, and the slit SHE can be collectively formed by photolithography. Furthermore, the memory hole MH, the hole HR, and the slit SHE can be simultaneously etched. Accordingly, it is possible to reduce the number of fabrication processes. Hence, it is possible to reduce a fabrication period, and to reduce fabrication cost.

According to the above embodiment, a semiconductor memory device which can reduce fabrication cost can be provided. The embodiment is not limited to the above embodiment, and can be modified in various ways.

For example, in the above embodiment, the mask pattern is formed by the resist 30, but a hard mask may be formed by photolithography using an insulating film or a metal film, and the hard mask may be used as the mask pattern.

For example, in the above embodiment, a structure in which three or more string units SU share the word lines WL and the select gate lines SGS may be used.

For example, in the above embodiment, the insulating layer 21 may not be an insulating layer which includes silicon and nitride. The insulating layer 21 may be made of any material so long as a sufficient etching selection ratio the insulating layers 20 is achieved by wet etching. Furthermore, the wet etching is not limited to wet etching in which a phosphoric acid solution is used.

Furthermore, "connection" which is described in the above embodiment includes an indirect connection in which, for example, a transistor, a resistor, or the like is interposed between the members connected to each other.

The above embodiment according to the invention may employ the following operational setting. For example, if threshold levels are referred to as an E level (erasure level), an A level, a B level, and a C level in an ascending order, when the memory cell transistor MT can retain data of two bits (four values) and retains any one of the four values, (1) in a read operation, a voltage which is applied to a word line that is selected in a read operation of the A level is one, for example, between 0 V and 0.55 V. The voltage is not limited to this, and may be one between 0.1 V and 0.24 V, between 0.21 V and 0.31 V, between 0.31 V and 0.4 V, between 0.4 V and 0.5 V, or between 0.5 V and 0.55 V.

A voltage which is applied to a word line that is selected in a read operation of the B level is one, for example, between 1.5 V and 2.3 V. The voltage is not limited to this, and may be one between 1.65 V to 1.8 V, between 1.8 V to 1.95 V, between 1.95 V to 2.1 V, or between 2.1 V to 2.3 V.

A voltage which is applied to a word line that is selected in a read operation of the C level is one, for example, between 3.0 V and 4.0 V. The voltage is not limited to this, and may be one between 3.0 V to 3.2 V, between 3.2 V to 3.4 V, between 3.4 V to 3.5 V, between 3.5 V to 3.6 V, or between 3.6 V to 4.0 V.

Time (tR) of the read operation may be one, for example, between 25 μs and 38 μs, between 38 μs and 70 μs, or between 70 μs and 80 μs.

(2) A write operation includes a program operation and a verification operation as described above. In the write operation, a voltage which is first applied to a word line that is selected at the time of the program operation is, for example, between 13.7 V to 14.3 V. The voltage is not limited to this, and may be, for example, between 13.7 V to 14.0 V, or between 14.0 V and 14.6 V.

A voltage which is first applied to a word line that is selected when data are written to odd-numbered word lines, and a voltage which is first applied to a word line that is selected when data are written to even-numbered word lines may be changed.

When an incremental step pulse program (ISPP) method is used for the program operation, for example, approximately 0.5 V can be used as a step-up voltage.

A voltage which is applied to an unselected word line may be, for example, between 6.0 V and 7.3 V. The voltage is not limited to this, and may be, for example, between 7.3 V and 8.4 V, and may be equal to or lower than 6.0 V.

A pass voltage which is applied may be changed depending on whether an unselected word line is an even-numbered word line or an odd-numbered word line.

Time (tProg) of the write operation may be, for example, between 1700 μs and 1800 μs, between 1800 μs and 1900 μs, or between 1900 μs and 2000 μs.

(3) In the erasing operation, a voltage that is first applied to a well which is formed on an upper portion of the semiconductor substrate and on which the memory cell is disposed is, for example, between 12 V and 13.6 V. The voltage is not limited to this, and may be, for example, between 13.6 V and 14.8 V, between 14.8 V and 19.0 V, between 19.0 V and 19.8 V, or between 19.8 V and 21 V.

Time (tErase) of the erasing operation may be, for example, between 3000 μs and 4000 μs, between 4000 μs and 5000 μs, or between 4000 μs and 9000 μs.

(4) A structure of the memory cell is configured to include an electric charge accumulation layer which is disposed on the semiconductor substrate (silicon substrate) through a tunnel insulating film that has a thickness of 4 nm to 10 nm. The electric charge accumulation layer can have a stacked structure of an insulating film such as an SiN film or an SiON film that has a thickness of 2 nm to 3 nm and a polysilicon film that has a thickness of 3 nm to 8 nm. In addition, metal such as Ru may be added to the polysilicon film. An insulating film is formed on the electric charge accumulation layer. The insulating film has a silicon oxide film that has a thickness of 4 nm to 10 nm between a lower layer High-k film that has a thickness of 3 nm to 10 nm and an upper layer High-k film that has a thickness of 3 nm to 10 nm. HfO or the like can be used as the High-k films. In addition, the thickness of the silicon oxide film can be greater than the thickness of the High-k film. A control electrode that has a thickness of 30 nm to 70 nm is formed on the insulating film through a material for work function adjustment that has a thickness of 3 nm to 10 nm. Here, the material for work function adjustment is a metal oxide film such as TaO and a metal nitride film such as TaN. W or the like can be used for the control electrode.

In addition, an air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a plurality of word-line layers formed above a substrate;
   a first select-line layer formed above the word-line layers in a first memory region of the substrate;
   a second select-line layer formed above the word-line layers in a second memory region of the substrate;
   one or more first pillars penetrating through the first select-line layer and the word-line layers in the first memory region and in contact with the substrate, and one or more second pillars penetrating through the second select-line layer and the word-line layers in the second memory region and in contact with the substrate, a plurality of memory transistors being formed at portions of the first and second pillars that penetrate the word-line layers; and
   a partitioning member electrically separating the first select-line layer and the second select-line layer, wherein
   each of the first pillars, the second pillars, and the partitioning member includes a semiconductor portion, a first insulating layer formed around the semiconductor portion, a charge accumulation layer formed around the first insulating layer, and a second insulating layer formed around the charge accumulation layer.

2. The semiconductor memory device according to claim 1, wherein
   a plurality of the first pillars is arranged along a first line extending in a first direction, on the first memory region of the substrate,
   a plurality of the second pillars is arranged along the first line, on the second memory region of the substrate, and
   the partitioning member extends in a second direction, which crosses the first line.

3. The semiconductor memory device according to claim 1, wherein
   the partitioning member does not penetrate any of the word-line layers.

4. The semiconductor memory device according to claim 1, wherein
   the semiconductor portion of each of the one or more first pillars and each of the one or more second pillars is connected to a bit line, and
   the semiconductor portion of the partitioning member is connected to no wiring line.

5. The semiconductor memory device according to claim 1, further comprising:
   one or more third pillars penetrating through at least one of the word-line layers on a peripheral region of the substrate and in contact with the substrate, each of the one or more third pillars includes a semiconductor portion, a first insulating layer formed around the semiconductor portion, a charge accumulation layer formed around the first insulating layer, and a second insulating layer formed around the charge accumulation layer.

6. The semiconductor memory device according to claim 5, wherein
   a plurality of the first pillars is arranged along a first line extending in a first direction, on the first memory region of the substrate,
   a plurality of the second pillars is arranged along the first line, on the second memory region of the substrate, and
   a plurality of the third pillars is arranged along a second line that is parallel to the first line, on the peripheral region of the substrate.

7. The semiconductor memory device according to claim 6, wherein
   each of the third pillars is located at end of one of the word-line layers.
8. The semiconductor memory device according to claim 6, further comprising:
   a plurality of contact pillars arranged along the line, each of the contact pillars being formed on an exposed surface of one of the wiring layers and electrically connected to a word line.
9. The semiconductor memory device according to claim 5, wherein
   the semiconductor portion of each of the first pillars is connected to a bit line, and
   the semiconductor portion of each of the third pillars is connected to no wiring line.

* * * * *